US009000801B1

(12) United States Patent
Ebeling et al.

(10) Patent No.: US 9,000,801 B1
(45) Date of Patent: Apr. 7, 2015

(54) IMPLEMENTATION OF RELATED CLOCKS

(71) Applicant: Tabula, Inc., Santa Clara, CA (US)

(72) Inventors: Christopher D. Ebeling, San Jose, CA (US); Michael Glenn Wrighton, Boulder, CO (US); Andrew Caldwell, Santa Clara, CA (US); Kent Townley, San Jose, CA (US)

(73) Assignee: Tabula, Inc., Mountain View, CA (US)

( * ) Notice: Subject to any disclaimer, the term of this patent is extended or adjusted under 35 U.S.C. 154(b) by 85 days.

(21) Appl. No.: 13/802,655

(22) Filed: Mar. 13, 2013

Related U.S. Application Data

(60) Provisional application No. 61/770,298, filed on Feb. 27, 2013.

(51) Int. Cl.
*H03K 19/177* (2006.01)
*H03K 19/173* (2006.01)

(52) U.S. Cl.
CPC .................................. *H03K 19/173* (2013.01)

(58) Field of Classification Search
None
See application file for complete search history.

(56) References Cited

U.S. PATENT DOCUMENTS

| | | |
|---|---|---|
| 4,873,459 A | 10/1989 | El Gamal et al. |
| 5,511,181 A | 4/1996 | Baxter |
| 5,578,946 A | 11/1996 | Carberry et al. |
| 5,589,782 A | 12/1996 | Sharpe-Geisler |
| 5,596,743 A | 1/1997 | Bhat et al. |
| 5,600,263 A | 2/1997 | Trimberger et al. |
| 5,610,829 A | 3/1997 | Trimberger |
| 5,629,637 A | 5/1997 | Trimberger et al. |
| 5,692,147 A | 11/1997 | Larsen et al. |
| 5,701,441 A | 12/1997 | Trimberger |
| 5,761,483 A | 6/1998 | Trimberger |
| 5,825,662 A | 10/1998 | Trimberger |
| 5,920,712 A | 7/1999 | Kuijsten |
| 6,018,559 A | 1/2000 | Azegami et al. |
| 6,020,758 A | 2/2000 | Patel et al. |
| 6,091,263 A | 7/2000 | New et al. |
| 6,097,776 A * | 8/2000 | Mesiwala ..................... 375/355 |
| 6,229,337 B1 | 5/2001 | Xiao et al. |
| 6,255,849 B1 | 7/2001 | Mohan |
| 6,404,224 B1 | 6/2002 | Azegami et al. |
| 6,469,553 B1 | 10/2002 | Sung et al. |
| 6,480,954 B2 | 11/2002 | Trimberger et al. |
| 6,487,709 B1 | 11/2002 | Keller et al. |
| 6,496,918 B1 | 12/2002 | Dehon et al. |
| 6,668,237 B1 | 12/2003 | Guccione et al. |

(Continued)

OTHER PUBLICATIONS

U.S. Appl. No. 12/960,459, filed Dec. 3, 2010, Townley, Kent, R., et al.

(Continued)

*Primary Examiner* — Crystal L Hammond
(74) *Attorney, Agent, or Firm* — Adeli LLP

(57) ABSTRACT

An integrated circuit (IC) that includes multiple clock domains is provided. Each clock domain operates at a user specified data rate, and the data rates of at least two of the clock domains are related by a common base clock. The specified data rate of each clock domain is controlled by a modulating signal. Each clock domain includes reconfigurable circuits that operate on the common base clock, and the modulating signal controls the data rate of the clock domain by modulating reconfiguration of the reconfigurable circuits. The reconfigurable circuits reconfigure when the modulating signal enables the reconfiguration.

21 Claims, 24 Drawing Sheets

(56) References Cited

U.S. PATENT DOCUMENTS

| | | | |
|---|---|---|---|
| 6,675,306 | B1 | 1/2004 | Baxter |
| 6,717,436 | B2 | 4/2004 | Kress et al. |
| 6,829,756 | B1 | 12/2004 | Trimberger |
| 6,882,182 | B1 | 4/2005 | Conn et al. |
| 6,920,627 | B2 | 7/2005 | Blodget et al. |
| 6,924,663 | B2 | 8/2005 | Masui et al. |
| 6,959,397 | B2 | 10/2005 | Cafaro et al. |
| 7,064,577 | B1 | 6/2006 | Lee |
| 7,116,131 | B1 | 10/2006 | Chirania et al. |
| 7,126,372 | B2 | 10/2006 | Vadi et al. |
| 7,129,746 | B1 | 10/2006 | Balasubramanian et al. |
| 7,138,827 | B1 | 11/2006 | Trimberger |
| 7,143,377 | B1 | 11/2006 | Kudlugi et al. |
| 7,157,933 | B1 | 1/2007 | Schmit et al. |
| 7,342,415 | B2 | 3/2008 | Teig et al. |
| 7,362,135 | B1 | 4/2008 | Chang |
| 7,398,414 | B2 | 7/2008 | Sherburne, Jr. |
| 7,433,397 | B2 | 10/2008 | Garlepp et al. |
| 7,680,233 | B1* | 3/2010 | Mauer .................. 375/372 |
| 7,779,380 | B2 | 8/2010 | Honda |
| 7,818,705 | B1 | 10/2010 | Hutton et al. |
| 7,822,881 | B2 | 10/2010 | Vorbach et al. |
| 8,037,340 | B2 | 10/2011 | Kim et al. |
| 2001/0033188 | A1 | 10/2001 | Aung et al. |
| 2002/0089349 | A1 | 7/2002 | Barbier et al. |
| 2002/0125914 | A1 | 9/2002 | Kim |
| 2002/0157071 | A1 | 10/2002 | Schiefele et al. |
| 2003/0184339 | A1 | 10/2003 | Ikeda et al. |
| 2004/0103265 | A1 | 5/2004 | Smith |
| 2004/0113655 | A1 | 6/2004 | Curd et al. |
| 2004/0225980 | A1 | 11/2004 | Cappelli et al. |
| 2005/0007155 | A1 | 1/2005 | Young |
| 2005/0046458 | A1 | 3/2005 | Schroeder et al. |
| 2005/0134308 | A1* | 6/2005 | Okada et al. ............. 326/39 |
| 2005/0246520 | A1 | 11/2005 | Vadi et al. |
| 2005/0280449 | A1 | 12/2005 | Kelkar et al. |
| 2006/0250168 | A1 | 11/2006 | Starr et al. |
| 2007/0143577 | A1 | 6/2007 | Smith |
| 2009/0172351 | A1 | 7/2009 | Vorbach et al. |
| 2013/0009695 | A1* | 1/2013 | Boucard ............... 327/530 |
| 2013/0104093 | A1 | 4/2013 | Huang et al. |
| 2013/0135008 | A1 | 5/2013 | Zhang et al. |

OTHER PUBLICATIONS

Portions of prosecution history of U.S. Appl. No. 12/960,459, Jul. 15, 2014, Townley, Kent, et al.

Author Unknown, "Unifying Sequential and Spatial Computing with a Single Instruction Set Architecture," ISCA '04, Jun. 19-23, 2004, 10 pages, ACM, Munchen, Oberbayem, Germany.

Boyer, F-R., et al., "Minimizing Sensitivity to Clock Skew Variations Using Level Sensitive Latches," Month Unknown, 2001, 4 pages.

Butts, M., "Future Directions of Dynamically Reprogrammable Systems," IEEE 1995 Custom Integrated Circuits Conference, May 1995, pp. 487-494.

Caspi, E., et al., "Stream Computations Organized for Reconfigurable Execution (SCORE): Introduction and Tutorial," Aug. 25, 2000, pp. 1-31, Version 1.0.

Compton, K., et al., "An Introduction to Reconfigurable Computing," IEEE Computer, Apr. 2000, 9 pages.

Compton, K., et al., "Reconfigurable Computing: A Survey of Systems and Software," ACM Computing Surveys, Jun. 2002, pp. 171-210, vol. 34, No. 2, ACM, New York, NY.

Dehon, A., "Balancing Interconnect and Computation in a Reconfigurable Computing Array (or, why don't you really want 100% LUT utilization)," Proceedings of the International Symposium on Field Programmable Gate Arrays, Feb. 1999, pp. 125-134.

Dehon, A., "DPGA Utilization and Application," Proceedings of the 1996 ACM Fourth International Symposium on Field-Programmable Gate Arrays FPGA, Feb. 11-13, 1996, 7 pages, Monterey, California, USA.

Dehon, A., "Dynamically Programmable Gate Arrays: A Step Toward Increased Computational Density," Proceedings of the Fourth Canadian Workshop on Field-Programmable Devices, May 1996, pp. 47-54.

Dehon, A., "Reconfigurable Architectures for General-Purpose Computing," A.I. Technical Report No. 1586, Oct. 1996, pp. i-353.

Dehon, A., "The Density Advantage of Configurable Computing," IEEE, Apr. 2000, pp. 41-49.

Dehon, A., "Transit Note #121: Notes on Programmable Interconnect," M.I.T. Transit Project, Feb. 1995, pp. 1-13.

Dehon, A., et al., "Design Patterns for Reconfigurable Computing," Proceedings of the IEEE Symposium on Field-Programmable Custom Computing Machines, Apr. 2004, 11 pages.

Dehon, A., et al., "DPGA-Coupled Microprocessors: Commodity ICs for the Early $21^{st}$ Century," FCCM '94—IEEE Workshop on FPGAs for Custom Computing Machines, Apr. 1994, 9 pages, Napa Valley, California, USA.

Dehon, A., et al., "Reconfigurable Computing: What, Why, and Implications for Design Automation," DAC 1999, Jun. 1999, 6 pages, ACM, New Orleans, Louisiana.

Enzler, R., et al., "Virtualizing Hardware with Multi-Context Reconfigurable Arrays," Lecture Notes in Computer Science, Sep. 2003, pp. 151-160.

Gayasen, A., et al., "Reducing Leakage Energy in FPGAs Using Region-Constrained Placement," FPGA '04, Feb. 22-24, 2004, pp. 51-58, ACM, Monterey, California, USA.

Giraud-Carrier, C., "A Reconfigurable Data Flow Machine for Implementing Functional Programming Languages", SIGPLAN Notices, Sep. 1994, vol. 29 No. 9, pp. 22-28.

Goldstein, S.C., et al., "PipeRench: A Reconfigurable Architecture and Compiler," IEEE, Apr. 2000, pp. 70-77.

Hauck, S., et al., "Montage: An FPGA for Synchronous and Asynchronous Circuits," Field-Programmable Gate Arrays: Architectures and Tools for Rapid Prototyping, 1993 Month N/A, 4 pages, Springer-Verlag, Berlin.

Hauck, S., et al., "Totem: Domain-Specific Reconfigurable Logic," IEEE Transactions on VLSI Systems, 2006 Month N/A, pp. 1-25.

Hauser, J., et al., "Garp: A MIPS Processor with a Reconfigurable Coprocessor", FPGAs for Custom Computing Machines, 1997. Proceedings., The 5th Annual IEEE Symposium on FPGA-Based Custom Computing Machines, Apr. 16-18, 1997, pp. 12-21.

Keutzer, K., "Overview of *configurable* architectures," Feb. 28, 2002, slides 1-29.

Lehn, D.I., et al., "Evaluation of Rapid Context Switching on a CSRC Device," Proceedings of the International Conference on Engineering of Reconfigurable Systems and Algorithms, Jun. 24-27, 2002, 7 pages.

Lertora, F., et al., "Handling Different Computational Granularity by a Reconfigurable IC Featuring Embedded FPGAs and a Network-On-Chip," 13th Annual IEEE Symposium on Field-Programmable Custom Computing Machines (FCCM 2005) 2005, Apr. 18-20, 2005.

Luk, W., et al., "Compilation Tools for Run-Time Reconfigurable Designs," FPGAs for Custom Computing Machines, 1997. Proceedings., The 5th Annual IEEE Symposium on FPGA-Based Custom Computing Machines, Apr. 16-18, 1997, pp. 56-65.

Markovskiy, Y., et al., "Analysis of Quasi-Static Scheduling Techniques in a Virtualized Reconfigurable Machine," FPGA '02, Feb. 24-26, 2002, 10 pages, ACM, Monterey, California, USA.

Master, P., "The Next Big Leap in Reconfigurable Systems," A Technology Vision Whitepaper, Apr. 28, 2004 but © 2003, pp. 1-8, QuickSilver Technology, Inc., San Jose, California.

Mirsky, E., et al., "MATRIX: A Reconfigurable Computing Architecture with Configurable Instruction Distribution and Deployable Resources," Proceedings of the IEEE Workshop on FPGAs for Custom Computing Machines, Apr. 1996, 10 pages.

Mirsky, E., et al., "MATRIX: A Reconfigurable Computing Device with Configurable Instruction Distribution and Deployable Resources (Extended Abstract)," Hot Chips Symposium 1997, Aug. 1997, pp. 1-3.

Nelson, B.E., "Reconfigurable Computing: An Introduction and Overview," Sep. 23, 1998, pp. 1-43.

Niedzielski, D., "An Overview of Reconfigurable Computing," NPL Date Unknown, 26 slides.

(56) References Cited

OTHER PUBLICATIONS

Perissakis, S., et al., "Embedded DRAM for a Reconfigurable Array," Proceedings of the 1999 Symposium on VLSI Circuits, Jun. 1999, slides 1-24.

Perissakis, S., et al., "Embedded DRAM for a Reconfigurable Array," Proceedings of the 1999 Symposium on VLSI Circuits, Jun. 1999, 4 pages.

Plunkett, B., et al., "Adapt2400 ACM Architecture Overview," A Technology Whitepaper, 2004 Month N/A, pp. 1-9, QuickSilver Technology, Inc.

QuickSilver Technology, Inc., "Adapt2000 ACM System Platform," Apr. 2004, pp. 1-39, QuickSilver Technology, Inc., San Jose, California, USA.

Scalera, S., et al., "The Design and Implementation of a Context Switching FPGA", FPGAs for Custom Computing Machines, 1998. Proceedings. IEEE Symposium on FPGAs for Custom Computing Machines, Apr. 15-17, 1998, pp. 78-85.

Schaumont, P., et al., "A Quick Safari Through the Reconfiguration Jungle," 38$^{th}$ Design Automation Conference, Jun. 2001, pp. 172-177, Las Vegas, Nevada, USA.

Schmit, H., "Incremental Reconfiguration for Pipelined Applications," Proceedings of the 5$^{th}$ IEEE Symposium on FPGA-Based Custom Computing Machines, Apr. 16-18, 1997, 9 pages.

Schmit, H., et al., "Queue Machines: Hardware Compilation in Hardware," Proceedings of the 10th Annual IEEE Symposium on Field-Programmable Custom Computing Machines, Apr. 22-24, 2002, 9 pages.

Slade, A.L., et al., "Reconfigurable Computing Application Frameworks," 11$^{th}$ Annual IEEE Symposium on Field-Programmable Custom Computer Machines, Apr. 9-11, 2003, 10 pages.

Snider, G., "Performance-Constrained Pipelining of Software Loops onto Reconfigurable Hardware," FPGA '02, Feb. 24-26, 2002, pp. 177-186, ACM, Monterey, California, USA.

Soviani, C., et al., "Optimizing Sequential Cycles through Shannon Decomposition and Retiming", Design, Automation, and Test in Europe, Mar. 10, 2006, pp. 1085-1090.

Tau, E., et al., "A First Generation DPGA Implementation," Proceedings of the Third Canadian Workshop on Field-Programmable Devices, May 1995, pp. 138-143.

Tau, E., et al., "Transit Note #114: A First Generation DPGA Implementation," M.I.T. Transit Project, Jan. 1995, pp. 1-8.

Tsu, W., et al., "HSRA: High-Speed, Hierarchical Synchronous Reconfigurable Array," Proceedings of the International Symposium on Field Programmable Gate Arrays, Feb. 1999, pp. 69-78.

Vuillemin, J., et al., "Programmable Active Memories: Reconfigurable Systems Come of Age," Very Large Scale Integration (VLSI) Systems, IEEE Transactions on vol. 4, Issue 1, Mar. 1996, pp. 56-69.

Xilinx, Inc., "Virtex-4 Family Overview," Advance Product Specification, Sep. 10, 2004, pp. 21-30, v1.1, Xilinx, Inc.

\* cited by examiner ions. Modern IC designs also often require sig-
IMPLEMENTATION OF RELATED CLOCKS

CLAIM OF BENEFIT TO PRIOR APPLICATIONS

This present Application claims the benefit of U.S. Provisional Patent Application 61/770,298, filed Feb. 27, 2013. U.S. Provisional Patent Application 61/770,298 is incorporated herein by reference.

BACKGROUND

Modern integrated circuit (IC) designs often require the design to be implemented with different clock domains. The circuits in these different clock domains often operate at unique clock frequencies in order to fulfill the different data rate requirements. Modern IC designs also often require signals to travel from one clock domain to another clock domain. While it is possible to send signals across different clock domains asynchronously, i.e., assuming the clocks driving the different clock domains are not related in any particular way, it is often not desirable to do so because asynchronous interface requires specialized circuitry that cannot be easily and predictably verified. Synchronous data transfer between clock domains on the other hand can be easily and predictably verified and does require specialized circuitry. It is almost always preferable to design synchronous domain crossings whenever possible.

In order for signals to successfully cross from one domain to another domain based on predicable, synchronous timing relationships, the two clocks driving the two domains must be related to a common base clock. Conventional approach to creating related clocks involves using either phase lock loops (PLLs) or clock dividers. FIG. 1A-B illustrates signals crossing different clock domains in an IC 100 that operate on related clocks. FIG. 1A illustrates related clocks (clock 1 and clock 2 driving clock domains 1 and 2, respectively) that come from different PLLs. Based on the reference clock, PLL 121 produces clock 1 and PLL 122 produces clock 2. Clock 1 directly drives the circuits (e.g., registers/flip-flops) in clock domain 1 while clock 2 directly drives the circuits in clock domain 2. In this instance, clocks 1 and 2 are related because the PLLs 121 and 122 are both operating off the same reference clock 105. Some ICs have PLLs capable of producing multiple, different outputs from a same reference clock. The different outputs of one of these PLLs are also related.

FIG. 1B illustrates related clocks that come from different clock dividers. The clock divider 171 produces clock 1 as a divided clock of the base clock 150, while the clock divider 172 produces clock 2 as a divided clock of the same base clock 150. In this instance, clocks 1 and 2 are related because the clock dividers are operating on a same base clock 150.

Though the different clock domains in FIGS. 1A and 1B are able to communicate synchronously, they are not in a same clock distribution network that is balanced to minimized skew. As a result, the clock skew between clock 1 and clock 2 will be appreciable. The skew between clock 1 and clock 2 makes the timing relationship between the two clock domains less predictable. The skew also limits the clock rates that the circuits in the two clock domains can operate on.

Therefore, there is a need for an IC in which related clock domains can synchronously communicate with each other by utilizing clocks from the same clock distribution network.

SUMMARY

Some embodiments of the invention provide an integrated circuit (IC) that includes multiple clock domains, each clock domain operating at a user specified data rate. The data rates of at least two of the clock domains are related by a common base clock. The specified data rate of each clock domain is controlled by a modulating signal. In some embodiments, the clock domain includes reconfigurable circuits that operate on the common base clock, and the modulating signal controls the data rate of the clock domain by modulating reconfiguration of the reconfigurable circuits. In some embodiments, the reconfigurable circuits reconfigure when the modulating signal enables the reconfiguration.

In some embodiments, the modulation of the counter enable signals and the loopering of the reconfiguration state is used to implement synchronously related clocks. In some embodiments, the reconfigurable circuits are programmed to perform operations that were defined by the user of the IC by referencing a set of clocks that are specified by a clock specification in a user design for an IC. In some embodiments, these clocks are not implemented as actual physical clocks in the IC, but rather as reconfigurable circuits controlled by loopering reconfiguration state that effectively implements the clocks according to the clock specification.

In some embodiments, the user of the IC specifies the frequencies of these effective clocks in addition to the relationship between these effective clocks. Reconfiguration states that are modulated to looper faster effectively implement faster or higher frequency clocks, while reconfiguration states that are modulated to looper slower effectively implement slower or lower frequency clocks. By precisely controlling the timing of the count enable signal to the different reconfiguration counters, some embodiments are able to flexibly implement different clocks according to user's specification.

In some embodiments, the looperness of the reconfiguration states and modulation of the counter enable signals can be precisely set or configured to implement different clocks or specify different data rates off a same common base clock. These configuration settings can also be used to create arbitrary relationships between related clocks. The characteristics of the different effective clocks are determined by modulated counter enable signals and reconfiguration states. The modulation of the counter enable signals and the looperness of reconfiguration states are both determined by configuration bits in some embodiments.

Some embodiments provide static scheduling of cross domain signals. Signals traveling between two clock domains with related clocks based on the same base clock are statically scheduled into slots that correspond to individual cycles of the base clock. In some embodiments, each of these slots uniquely corresponds to a periodically recurring pairing of reconfiguration states from the two clock domain. In some embodiments, such slots are statically scheduled as part of the user design or by configuration control bits.

In some embodiments, a circuit module that generates the modulated count enable signal and the count init signal receives a reference signal for aligning reconfiguration state with the reference clock. In some embodiments, the reference signal is a periodic signal that is also referred to as a reference clock. In some embodiments, a reference clock is provided by an external source for synchronizing the circuits in the IC with circuits outside of the IC. In some embodiments, a reference signal is a pulse that does not have predictable periods. In some embodiments, each detected pulse of reference signal enables the reconfiguration state to run for a limited time interval. Once that limited time interval has expired, the count enable signal de-asserts and the reconfigurable circuit will not operate.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings, but rather are to be defined by the appended claims, because the claimed subject matters can be embodied in other specific forms without departing from the spirit of the subject matters.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide an integrated circuit (IC) that includes multiple clock domains, each clock domain operating at a user specified data rate. The data rates of at least two of the clock domains are related by a common base clock. The specified data rate of each clock domain is controlled by a modulating signal. In some embodiments, the clock domain includes reconfigurable circuits that operate on the common base clock, and the modulating signal controls the data rate of the clock domain by modulating reconfiguration of the reconfigurable circuits. In some embodiments, the reconfigurable circuits reconfigure when the modulating signal enables the reconfiguration.

Figure 2:
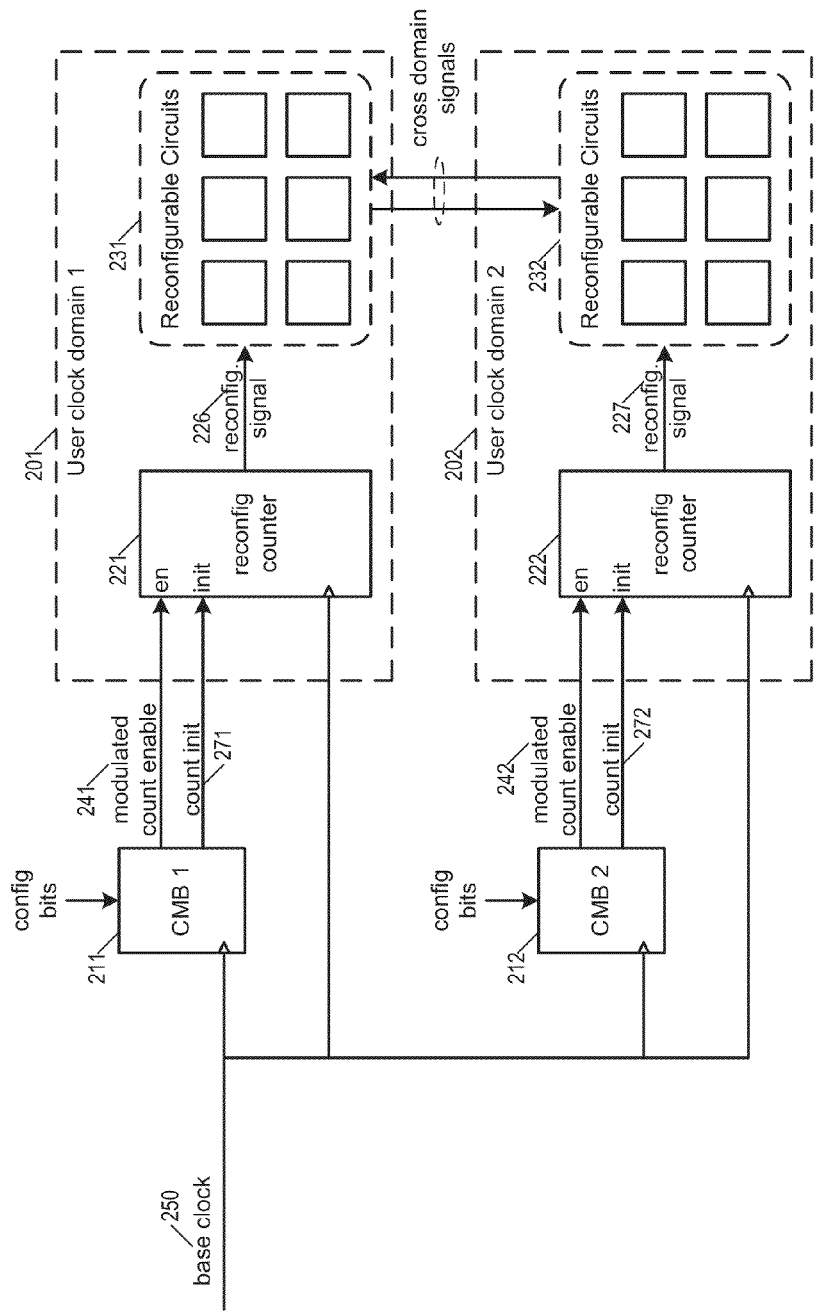
FIG. 2 illustrates an IC that includes multiple clock domains with user specified data rates that are related by a common base clock.

FIG. 2 illustrates an IC that includes multiple clock domains with user specified data rates that are related by a common base clock. The data rate of each clock domain is controlled by a modulating signal. As illustrated, FIG. 2 illustrates an IC 200 that includes clock domains 201 and 202, which are controlled by clock management blocks (CMBs) 211 and 212, respectively. The clock domain 201 includes a reconfiguration counter 221 and reconfigurable circuits 231. The clock domain 202 includes a reconfiguration counter 222 and reconfigurable circuits 232. The circuits included in the clock domains 201 and 202 as well as circuits in CMBs 211 and 212 all operate on a common base clock 250.

The operations of reconfigurable circuits in a particular domain are controlled by the reconfiguration state of that domain. The reconfiguration counter 221 supplies the reconfiguration signal 226 to the reconfigurable circuits 231. The reconfiguration signal 226 carries the reconfiguration state of the clock domain 201, which determines the operations of the reconfigurable circuits 231. Likewise, the reconfiguration counter 222 supplies the reconfiguration signal 227 to the reconfigurable circuits 232. The reconfiguration signal 227 carries the reconfiguration state of the clock domain 202, which determines the operations of the reconfigurable circuits 231. This document uses the term "reconfiguration state" and "reconfiguration signal" interchangeably, though reconfiguration signal generally refers to the set of connections from the reconfiguration counter to the reconfigurable circuits in some embodiments, while reconfiguration state generally refers to the operational state of the reconfigurable circuits, which is the also the count of the reconfiguration counter being carried by the reconfiguration signal in some embodiments.

The reconfigurable circuits 231 and 232 reconfigure to implement different operations or logic functions based on different sets of configuration data. These different sets of configuration data are part of a user design that is being implemented on the IC. In some embodiments, reconfigurable circuits periodically "loop" through a set of reconfiguration states or stages. The reconfiguration state of a set of reconfigurable circuits determines which of the different sets of configuration data is retrieved, which in turn determines the operations or logic functions that is to be performed by the set of reconfigurable circuits. Reconfigurable circuits will be discussed further below in Section V.

In some embodiments, the reconfiguration state of a set of reconfigurable circuits is supplied by a reconfiguration counter as a reconfiguration signal. In the example of FIG. 2, the reconfiguration state determining the operations of reconfigurable circuit 231 (in clock domain 201) is supplied by the reconfiguration counter 221 in reconfiguration signal 226, while the reconfiguration state determining the operations of reconfigurable circuit 232 (in clock domain 202) is supplied by the reconfiguration counter 222 in reconfiguration signal 227.

In some embodiments, the loopering of the reconfiguration states is necessary for completing a user defined operation. A user defined operation is an operation that is specified by the user design, and these user defined operations are defined in terms of or by referencing user defined clocks (or user clocks in user design). The user defined operations are decomposed and mapped into a set of operations performed by the reconfigurable circuits in different reconfiguration states. The reconfiguration counters (e.g., 221 and 222) operate on the faster running base clock and select between different reconfiguration states.

Each operation being performed during each reconfiguration state of the loopering is a necessary sequential step toward the completion of the user defined operation. In these instances, the speed by which the reconfigurable circuits loopers directly determines the rate by which the reconfigurable circuits process data. The quicker the reconfiguration circuits looper through the different reconfiguration states, the faster the data rate when performing the user defined operation. On the other hand, some embodiments modulate the loopering of reconfiguration states in order to meet a particular data rate specified by the user.

The reconfiguration counters 221 and 222 provide the reconfiguration signals 226 and 227 for the reconfigurable circuit 231 and 232, respectively. Each reconfiguration counter maintains a count that defines the reconfiguration state in some embodiments. The count advances and wraps/loops to an initial count when the count reaches a last reconfiguration state, which correspond to the "looperness" of the reconfiguration state or of the reconfigurable circuits controlled by the reconfiguration state. For example, a set of reconfigurable circuits is said to have a "looperness" of twelve if there are twelve reconfiguration states within each looper (e.g., S0, S1 . . . S11) such that the reconfiguration state starts at S0, increment to reach S11 (the twelveth and the last reconfiguration state), and then wraps back to S0.

The reconfiguration counters 221 and 222 operate on the common base clock 250 in some embodiments. Each of the reconfiguration counters has init port ('init') that sets the count of the reconfiguration counter to an initial count (defining the initial reconfiguration state). Each reconfiguration counter also has an enable ('en') port that controls whether the counter stays at the same count or enabled to advance to the next count at the next active edge (e.g., rising or falling) of the base clock 250. For some embodiments, modulating the count enable signal to the reconfiguration counter of a particular clock domain effectively modulates the loopering of reconfiguration states of that clock domain (and hence the data rate of the reconfigurable circuits of that clock domain). As illustrated, each reconfiguration counter also receives a count init signal from a CMB to reset the reconfiguration state to the starting/initial reconfiguration state in some embodiments. Reconfiguration counter will be further described below by reference to FIG. 6.

The CMBs 211 and 212 are circuit modules that provide modulated count enable signals 241 and 242 to the reconfiguration counters of the clock domains 201 and 202 respectively. Each CMB receives a set of configuration/control bits, and at least some of the configuration bits are static control bits that are used to control the modulation of the count enable signal. The control of the modulation of the count enable signal will be further described below by reference to FIG. 7-9. In some embodiments, each CMB can be configurably connected to one or more reconfiguration counters. The reconfiguration counters that are driven by a same CMB share a same set of modulated count enable signal and count init signal in addition to the same base block. In some embodiments, all reconfiguration counters (and their associated circuits) connected to a same CMB act as one single clock domain. On the other hand, the clock domain 201 and the clock domain 202 of FIG. 2 are driven by different CMBs 211 and 212. The count enable signal 241 for clock domain 201 and the count enable signal 242 for clock domain 202 can therefore be independently modulated by the different CMBs 211 and 212. The use of the CMBs in an IC will be further described below by reference to FIGS. 7 and 11. One of ordinary skill would realize that the count enable signals can be produced and modulated by other modules in the IC in some embodiments.

Figure 1A:
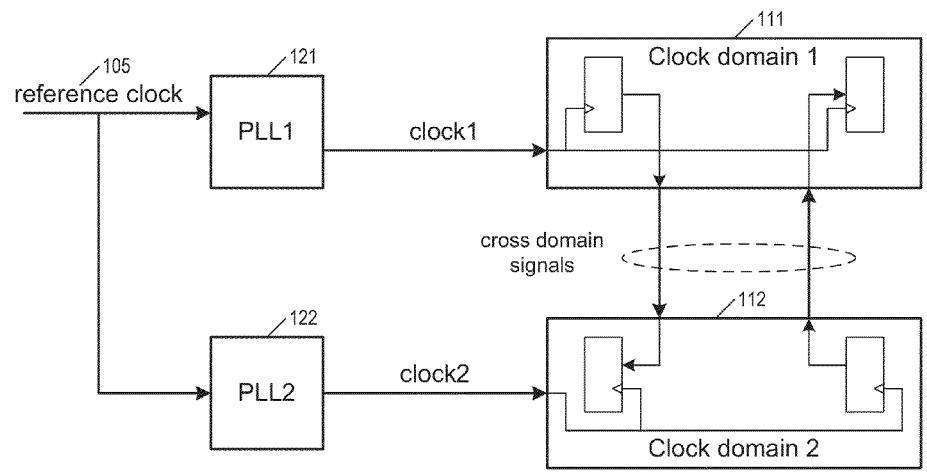
FIG. 1A-B illustrates signals crossing different clock domains that operate on related clocks.
Figure 1B:
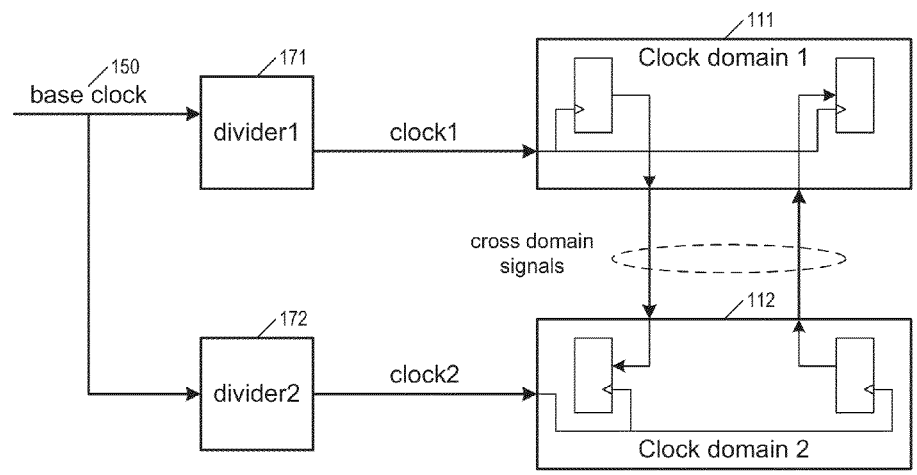

FIG. 2 also illustrates signals that travel between clock domain 201 to clock domain 202. The signals can travel between the two clock domains synchronously and with predictable timing relationships because circuits in both clock domains (such as reconfigurable circuits and reconfiguration counters) operate on the same base clock 250. The data rates of the clock domains 231 and 232 are thus related because of their common basis in the base clock 250. In some embodiments, the circuits in both clock domain 201 and clock domain 202 are on the same clock distribution tree for the base clock. Being on the same clock distribution tree minimizes clock skews between the different clock domains, unlike systems in which circuits actually operates on different clocks that come from different PLLs, different PLL outputs, or different clock dividers (e.g, those illustrated in FIGS. 1A and 1B).

I. Implementation of Related Clocks

In some embodiments, the modulation of the counter enable signals (and the loopering of the reconfiguration state) is used to implement (synchronously) related clocks. In some embodiments, the reconfigurable circuits are programmed to perform operations that were defined by the user of the IC by referencing a set of clocks that are specified by a clock specification in a user design for an IC (or user clocks). In some embodiments, these clocks are not implemented as actual physical clocks in the IC, but rather as reconfigurable circuits controlled by loopering reconfiguration state that effectively implements the clocks according to the clock specification. These effectively implemented clocks are referred to as effective clocks or user clocks in some embodiments. In some embodiments, actual physical clocks that reproduce the phase and frequency of the clocks specified in the clock specification are present and used in the IC.

In some embodiments, the user of the IC specifies the frequencies of these effective clocks in addition to the relationship (e.g., phase offset) between these effective clocks. Reconfiguration states that are modulated to looper faster effectively implement faster (or higher frequency) clocks, while reconfiguration states that are modulated to looper slower effectively implement slower (or lower frequency) clocks. By precisely controlling the timing of the count enable signal to the different reconfiguration counters, some embodiments are able to flexibly implement different clocks according to user's specification (e.g., frequency and phase relationship).

These different effective clocks are related because of their common basis in the common base clock. In the example of FIG. 2, the count enable signal 241 implement an effective clock for the clock domain 201 by controlling the loopering of the reconfiguration counter 221, while the count enable signal 242 implement an effective clock for the clock domain 202 by controlling the loopering of the reconfiguration counter 222. These two effective clocks are related by their common basis in the base clock 250, which drives the circuits in both clock domains.

Figure 3:
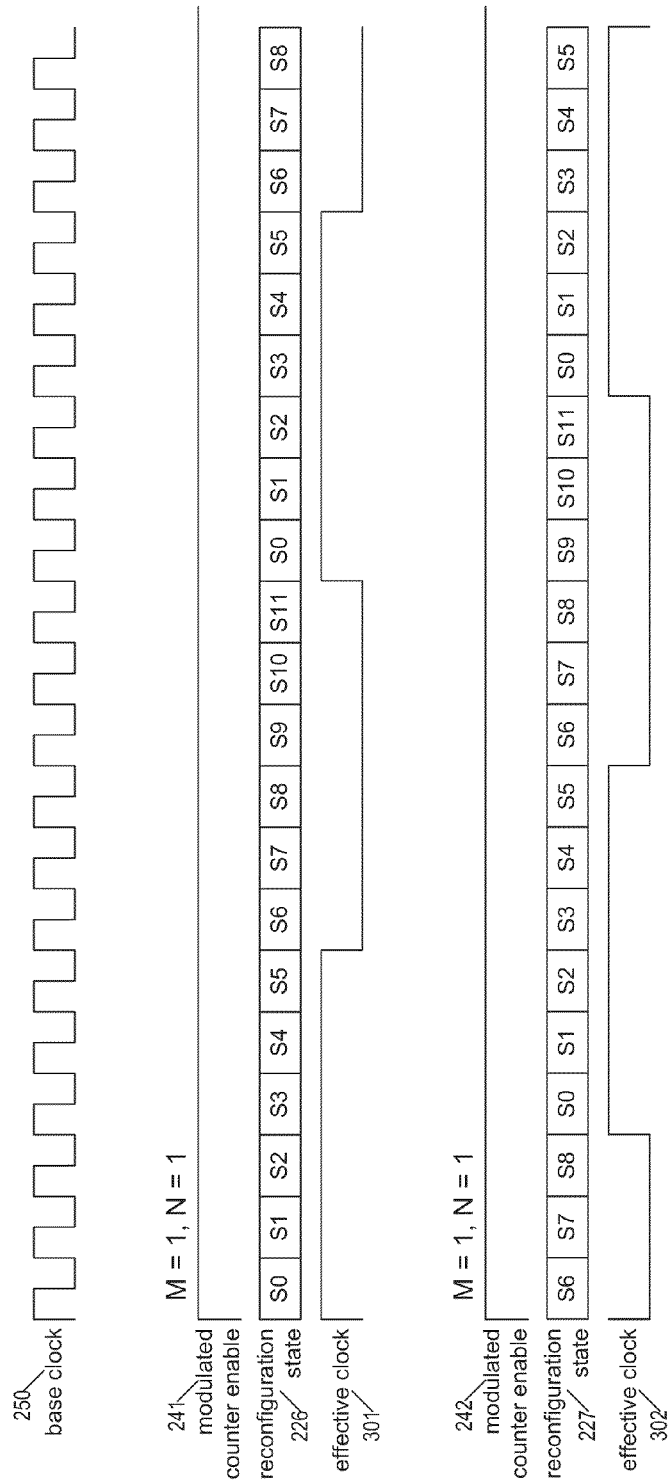
FIG. 3 illustrates user defined clocks that are implemented by the loopering of reconfiguration state.

FIG. 3 illustrates clocks that are effectively implemented by the loopering of reconfiguration states. FIG. 3 illustrates effective clocks 301 and 302 that are related on the basis of the base clock 250. The effective clock 301 is based on the loopering of the reconfiguration state 226, which is carried by the reconfiguration signal 226 to the clock domain 201. The effective clock 302 is based on the loopering of the reconfiguration state 227, which is carried by the reconfiguration signal 227 to the clock domain 202.

The reconfiguration state 226 loopers through twelve reconfiguration states (S0 through S11). The reconfiguration state advances on rising edge of the base clock 250 whenever the counter enable signal 242 is asserted to enable reconfiguration counter. In the example of FIG. 3, the reconfiguration state 226 advances on every rising edge of the base clock 250 (i.e., every cycle of the base clock) since the counter enable 241 is always asserted. The loopering of reconfiguration state 226 corresponds to the effective clock 301, as some embodiments use operations performed by the reconfigurable circuits 231 during the different reconfiguration states of a looper (S0 through S11 in this example) to implement a user defined operation. The loopering of the reconfiguration state therefore implements an effective clock that corresponds to a clock specified in the user design that has its rising edge before the start of the first reconfiguration state (i.e., S0) and its falling edge in the middle of the loopering sequence (i.e., before S6).

The reconfiguration state 227 also loopers through twelve reconfiguration states (S0 through S11) and advances on every rising edge of the base clock 250 because the counter enable signal 242 is always asserted. The loopering of the twelve reconfiguration states implements an effective clock 302) that correspond to a clock specified in the user design that also has its rising edge before the start of the first reconfiguration state (i.e., S0) and its falling edge in the middle of the loopering sequence (i.e., before S6).

Effective clocks 301 and 302 are related by their mutual basis in the base clock 250. They have identical frequencies since the looperness (twelve) of reconfiguration state 226 is the same as the looperness of reconfiguration state 227 and that both reconfiguration state advances on every cycle of the base clock. However, the two related clocks have an offset phase relationship. Specifically, when reconfiguration state 226 is at S0 (i.e., the rising edge of user clock 301), the reconfiguration state 227 is at S9. The two related clocks therefore have a 90° phase offset. In some embodiments, such offset are specified as part of user design. Some embodiments implement such phase offsets by starting reconfiguration counters at different times, or starting reconfiguration counter at different count. In some embodiments, the IC includes circuitry that aligns the reconfiguration state of different clock domains at either no offset or at a specified offset.

Figure 4:
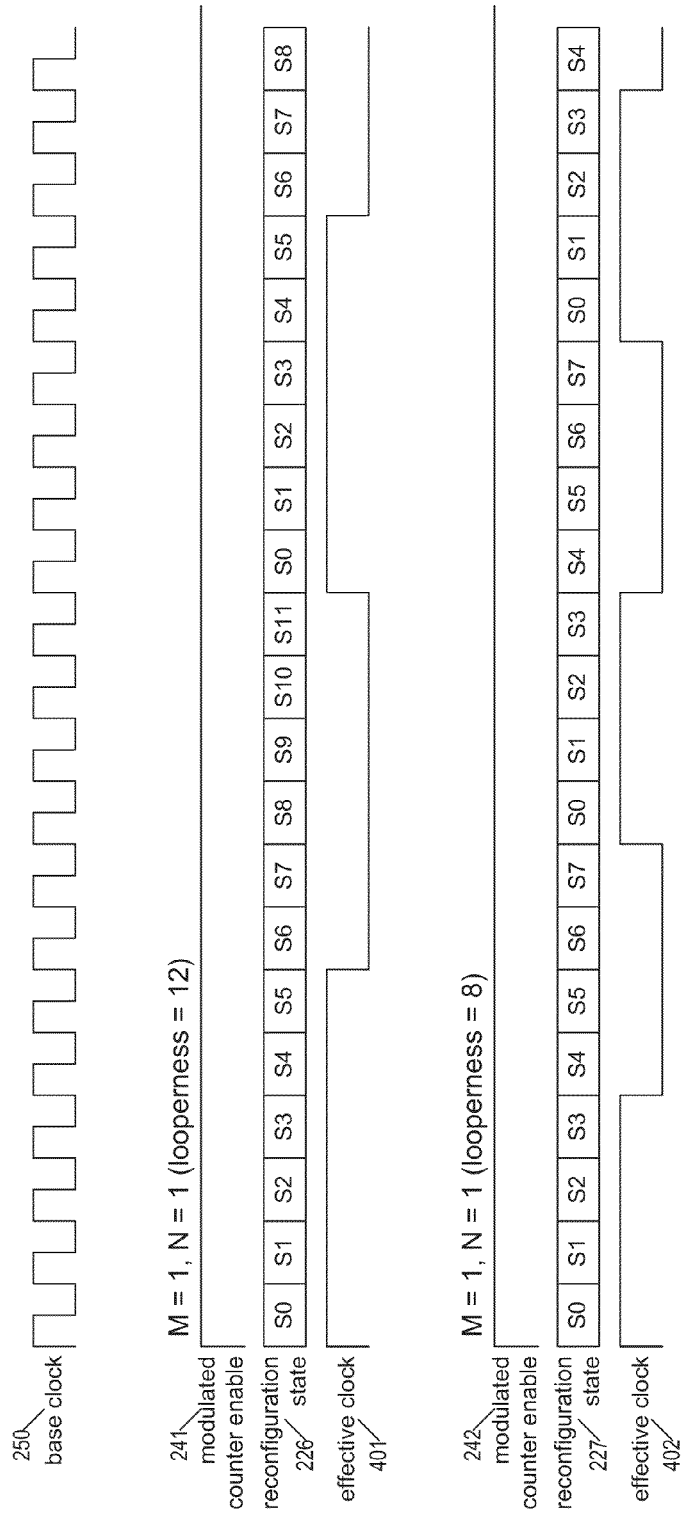
FIG. 4 illustrates related clocks having different frequencies because of different degree of looperness.

FIG. 4 illustrates related clocks having different frequencies because of different looperness. Like FIG. 3, FIG. 4 illustrates two clocks 401 and 402 that are specified by user and related on the basis of the base clock 250. The clock 401 is effectively implemented by the loopering of the reconfiguration state 226 and the clock 402 is effectively implemented by the loopering of the reconfiguration state 227. As in FIG. 3, both reconfiguration state 226 and reconfiguration state 227 advances every clock cycle because counter enable signals 241 and 242 are both always asserted. However, the looperness of the reconfiguration state 246 is different from the looperness of the reconfiguration state 247 in the example of FIG. 4. Specifically, the reconfiguration state 226 loopers from S0 to S11 (looperness of 12) while the reconfiguration state 227 loopers from S0 to S7 (looperness 8). As a result, the effective clock 401 (based on the 12-looper reconfiguration state 226) has a lower clock rate/lower frequency than the effective clock 402 (based on the 8-looper reconfiguration state 227).

As mentioned, the advance of reconfiguration state is controlled by the counter enable signal to the reconfiguration counter. Since the loopering of reconfiguration state of a clock domain determines the frequency and phase of the effective clock for that clock domain, some embodiments therefore use the counter enable signal of a clock domain to control the loopering of reconfiguration state, and thereby control the characteristics of the effective clock. In other words, the IC in some of these embodiments uses the modulation of the counter enable signals to implement the data rates or clock rates that are specified by the user. By modulating different counter enable signals to different clock domains differently, some embodiments are able implement related clocks that have arbitrary, but precisely specified relationships.

Figure 5:
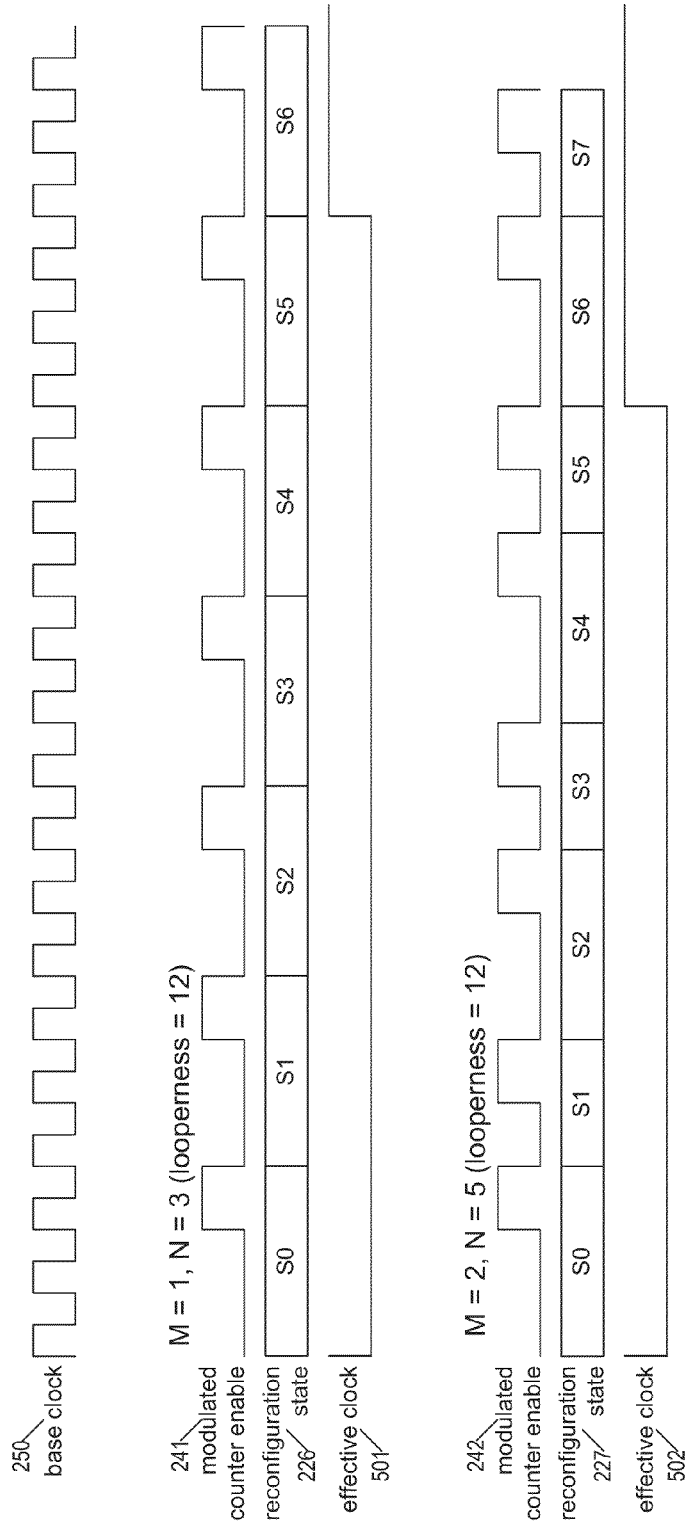
FIG. 5 illustrates the use of modulated counter enable signals to effectively implement different clocks.

FIG. 5 illustrates the use of modulated counter enable signals to implement different clocks that are specified by the user design. The modulation of counter enable signals effectively implements the different clocks to have arbitrarily specified relationships. Like FIGS. 3-4, FIG. 5 illustrates two clocks 501 and 502 that are related on the basis of the base clock 250. The clock 501 is effectively implemented by the loopering of the reconfiguration state 226 and the clock 402 is effectively implemented by the loopering of the reconfiguration state 227.

Unlike the counter enable signals illustrated in FIG. 3-4, the counter enable signals 241 and 242 of FIG. 5 are modulated. Specifically, the counter enable signal 241 is modulated to assert once every three clock cycles (M=1, N=3), and the counter enable signal 242 is modulated to assert twice every five clock cycles (M=2, N=5). Both the reconfiguration state 226 and the reconfiguration state 227 are 12-loopered in the example of FIG. 5.

As the counter enable signal 241 is modulated to assert once every three clock cycles, the reconfiguration state 226 advances only once every three cycles as well. This creates an effective clock (or implements a data rate) with a frequency that is $1/3 * 1/12 = 1/36$ of the frequency of the base clock 250 (or $1/3$ of the frequency of when counter enable 241 is not modulated like for the clocks 301 and 302 of FIG. 3). Likewise, as the counter enable signal 242 is modulated to assert twice every five clock cycles, the reconfiguration state 227 advances twice every five clock cycles to create an effective clock having a frequency that is $2/5 * 1/12 = 1/30$ of the frequency of the base clock 250. Though the frequencies of the two clocks are different ($1/36$ and $1/30$), they are still related clocks derived from the same common base clock 250. Furthermore, the circuits in the two different clock domains are still both operating on the same common base clock. This allows signals to cross between the clock domain of clock 501 and the clock domain of clock 502 synchronously due to the determinism in their respective reconfiguration states.

In some embodiments, a reconfiguration counter is a counter that increments the reconfiguration state (i.e., which is the count of the counter in some embodiments) when receiving the count enable signal and wraps back to the starting or initial reconfiguration state when the last reconfiguration state is reached. The reconfiguration counter also receives a count init signal to reset the reconfiguration state to the starting/initial reconfiguration state in some embodiments.

Figure 6:
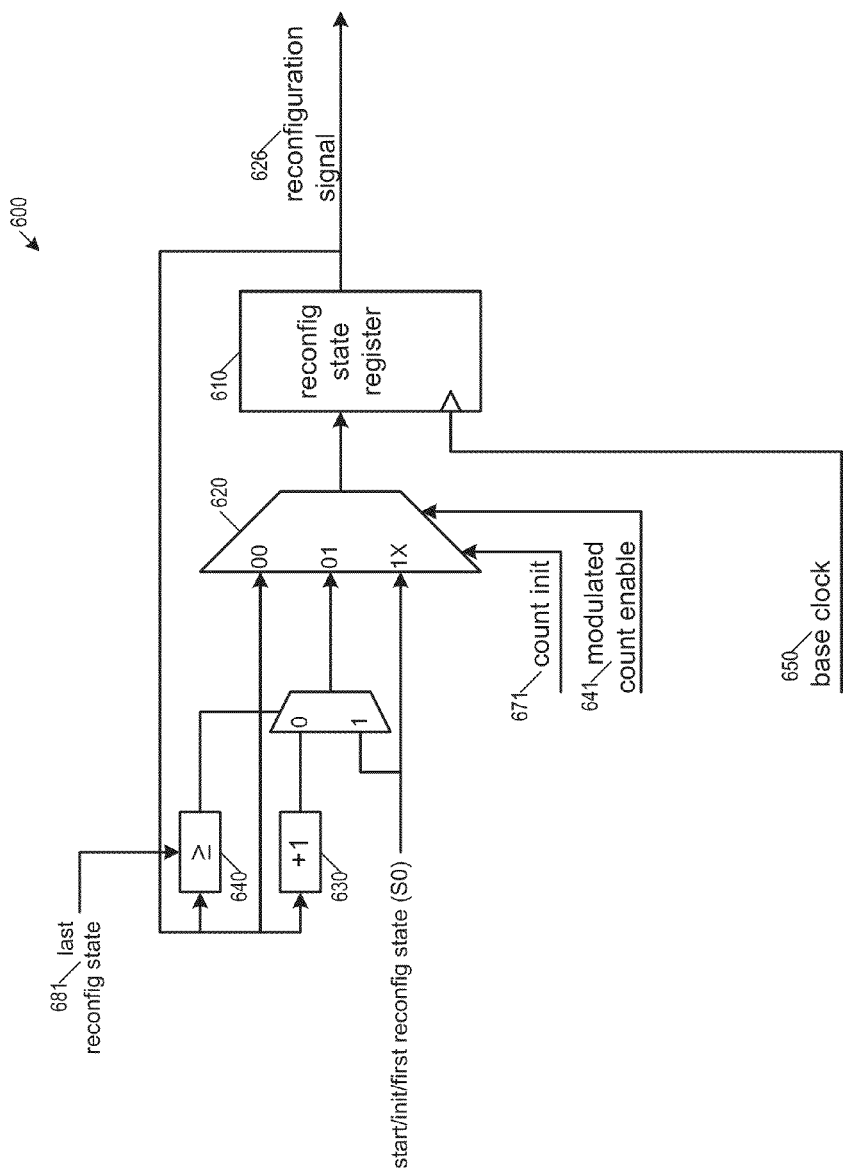
FIG. 6 illustrates an example reconfiguration counter that can be used to generate reconfiguration state based on modulated count enable signal.

FIG. 6 illustrates an example reconfiguration counter 600 that can be used to generate reconfiguration state based on modulated count enable signal. As illustrated, the reconfiguration counter 600 receives a base clock 650 and produces reconfiguration signal 626 as output for carrying the reconfiguration state. The reconfiguration counter 600 also receives a modulated count enable signal 641, a count init signal 671, and a last reconfiguration state specification 681. The reconfiguration counter 600 includes a reconfiguration state register 610, a next reconfiguration state multiplexer 620, an adder 630, and a comparator 640.

The reconfiguration state register 610 is a register that operate on the base clock 650. The reconfiguration state register 610 has enough bit width to maintain and to source the reconfiguration signal 626. The reconfiguration state register 610 clocks in a new set of data from the next reconfiguration state multiplexer 620 on every rising edge of the base clock 650 (i.e., the reconfiguration state register operate on the base clock and latch in a new set of data every cycle of the base clock 650).

The next reconfiguration state multiplexer 620 select from one of three inputs based on the modulated count enable signal 641 and the count init signal 671. The selected input is then supplied to the reconfiguration state register 610 as the next reconfiguration state. The multiplexer selects the current reconfiguration state 626 as the next reconfiguration state when the modulated count enable is not asserted (i.e., keeping the same reconfiguration state). If the modulated count enable is asserted, the next reconfiguration state multiplexer 620 selects the either an incremented reconfiguration state from the adder 630 or the first reconfiguration state (i.e., S0) when reconfiguration state counter has reached the last reconfiguration state in the looper (S11 for a 12-looper reconfiguration state). The comparator 640 receives the last reconfiguration state specification and determines whether the current reconfiguration state has reached the last reconfiguration state. The last reconfiguration state specification 681 is provided by configuration control bits in some embodiments for specifying the "looperness" of the reconfiguration state. When the count init signal 671 is asserted, the next reconfiguration state counter selects S0.

One of ordinary skill would realize that there are other possible circuit implementations for the reconfiguration counter 600. For example, instead comparing the current reconfiguration state with the last reconfiguration state ("S11" for 12-looper), some embodiments compare the incremented version of the reconfiguration state (e.g., output of the adder 630) with the "looperness" of the reconfiguration state ("S12" for 12-looper). The next reconfiguration state multiplexer 620 can also be implemented to include a modulus operator that causes the reconfiguration state to wrap around to the initial reconfiguration state when last reconfiguration state is reached.

II. Modulating Count Enable to Reconfiguration State

Figure 7:
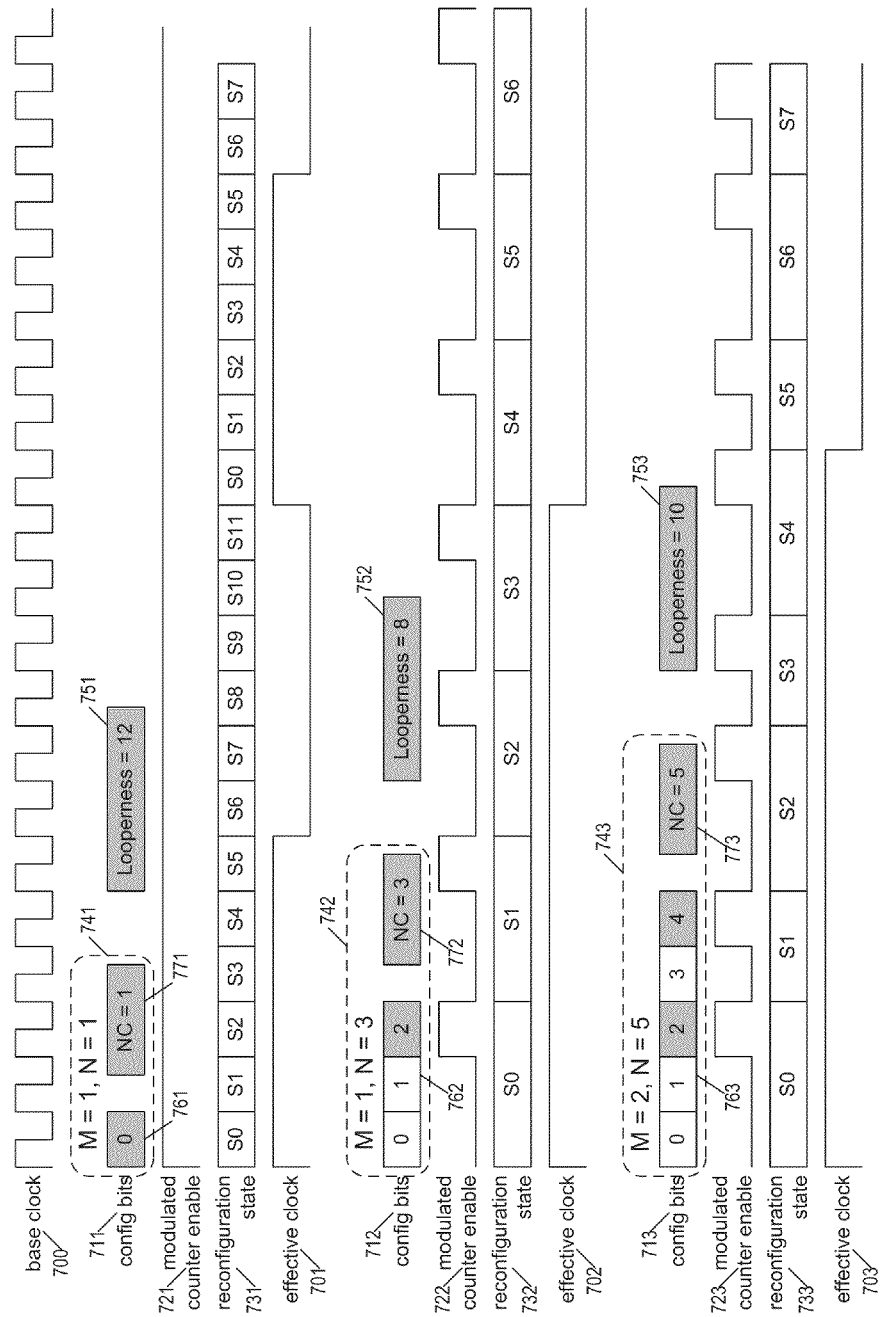
FIG. 7 illustrates the use of configuration bits to effectively implement different clocks.

In some embodiments, the looperness of the reconfiguration states and modulation of the counter enable signals can be precisely set or configured to implement different clocks (or specify different data rates) off a same common base clock. These configuration settings can also be used to create arbitrary relationships between related clocks. FIG. 7 illustrates the use of configuration bits to effectively implement different clocks. The characteristics of the different effective clocks are determined by modulated counter enable signals and reconfiguration states. The modulation of the counter enable signals and the looperness of reconfiguration states are both determined by configuration bits. As mentioned above by reference to FIG. 2 above, the modulation of count enable signal is performed by CMBs in some embodiments.

FIG. 7 illustrates three different clocks 701, 702, and 703 that are related on the basis of a base clock 700. The three different clocks are specified by three sets of configuration bits 711, 712, and 713. The clock 701 is effectively implemented from reconfiguration state 731, which is controlled by a counter enable signal 721. The clock 702 is effectively implemented from reconfiguration state 732, which is controlled by a counter enable signal 722. The clock 703 is effectively implemented from reconfiguration state 733, which is controlled by a counter enable signal 723. The looperness of the reconfiguration states 731, 732, and 733 and the modulation of the counter enable signals 721, 722, and 733 are controlled by configuration bits 711, 712, and 713.

The configuration bits 711 specify the looperness 751 of reconfiguration state 731, as well as the modulating parameters 741 for the counter enable signal 721. The looperness 751 of the reconfiguration state 731 is specified to be 12 (or the last configuration state to be S11). As a result, the reconfiguration states 731 increments from S0 to S11 before wrapping back to S0, and the effective clock 701 rises before S0 and falls after S5.

The modulating parameters 741 include a NC field 771 and an assertion pattern field 761. These two fields specify a periodic recurring pattern for the modulated counter enable signal 721. The NC field specifies the number of base clock cycles in each of the recurring pattern. The assertion pattern field specifies when to assert the modulated counter enable signal within each recurring pattern. In this instance, the NC field 771 specifies that the number of clock cycles in each of the recurring pattern to be 1, and that the modulated counter enable signal 721 is to be asserted in the first (and only) clock cycle in that recurring pattern. In other words, the modulating parameter 741 specifies that the counter enable signal 721 to remain asserted. Given that the looperness of reconfiguration state 731 is set to 12, the frequency of the resulting effective clock 701 will be ¹⁄₁₂ of the frequency of the base clock 700.

The configuration bits 712 specify the looperness 752 of reconfiguration state 732, as well as the modulating parameters 742 for the counter enable signal 722. The looperness 752 of the reconfiguration state 732 is specified to be 8 (or the last configuration state to be S7). As a result, the reconfiguration states 732 increments from S0 to S7 before wrapping back to S0, and the clock 702 rises before S0 and falls after S3.

The modulating parameters 742 include a NC field 772 and an assertion pattern field 762. The NC field 772 specifies that the number of base clock cycles in each of the recurring pattern to be 3, and that the modulated counter enable signal 722 is to be asserted in the last clock cycle (as indicated by the darkened cycle 2) in that recurring pattern. In other words, the modulating parameter 742 specifies that the counter enable signal 722 to be asserted once every 3 clock cycles (M=1, N=3). Given that the looperness of reconfiguration state 732 is set to 8, the frequency of the resulting effective clock 702 will be ⅓ *⅛=1/24 of the frequency of the base clock 700.

The configuration bits 713 specify the looperness 753 of reconfiguration state 733, as well as the modulating parameters 743 for the counter enable signal 723. The looperness 753 of the reconfiguration state 733 is specified to be 10 (or the last configuration state to be S9). As a result, the reconfiguration states 733 increments from S0 to S9 before wrapping back to S0, and the clock 703 rises before S0 and falls after S4.

The modulating parameters 743 include a NC field 773 and an assertion pattern field 763. The NC field 773 specifies that the number of base clock cycles in each of the recurring pattern to be 5, and that the modulated counter enable signal 723 is to be asserted in the third cycle (cycle 2) and the fifth cycle (cycle 4) in that recurring pattern. In other words, the modulating parameter 743 specifies that the counter enable signal 723 to be asserted twice every 5 clock cycles (M=2, N=5). Given that the looperness of reconfiguration state 732 is set to 10, the frequency of the resulting effective clock 703 will be ⅖ *1/10=1/25 of the frequency of the base clock 700.

In some embodiments, each base clock cycle in the recurring pattern has its own corresponding configuration/control bit to indicate whether the counter enable should be asserted for that clock cycle (e.g., specifying that counter enable is to be asserted in cycle 2 and cycle 4 in a five cycle pattern). In some embodiments, the configuration bit indicates only how often is the counter enable signal asserted (e.g., specifying that counter enable is to be asserted twice in five cycles) within the recurring pattern while the IC automatically determines when to actually assert the counter enable signal. One of ordinary skill would understand that there are many other possible ways of specifying the modulation of the count enable signals, and that different embodiments may specify the modulation of the count enable signals differently.

Figure 8:
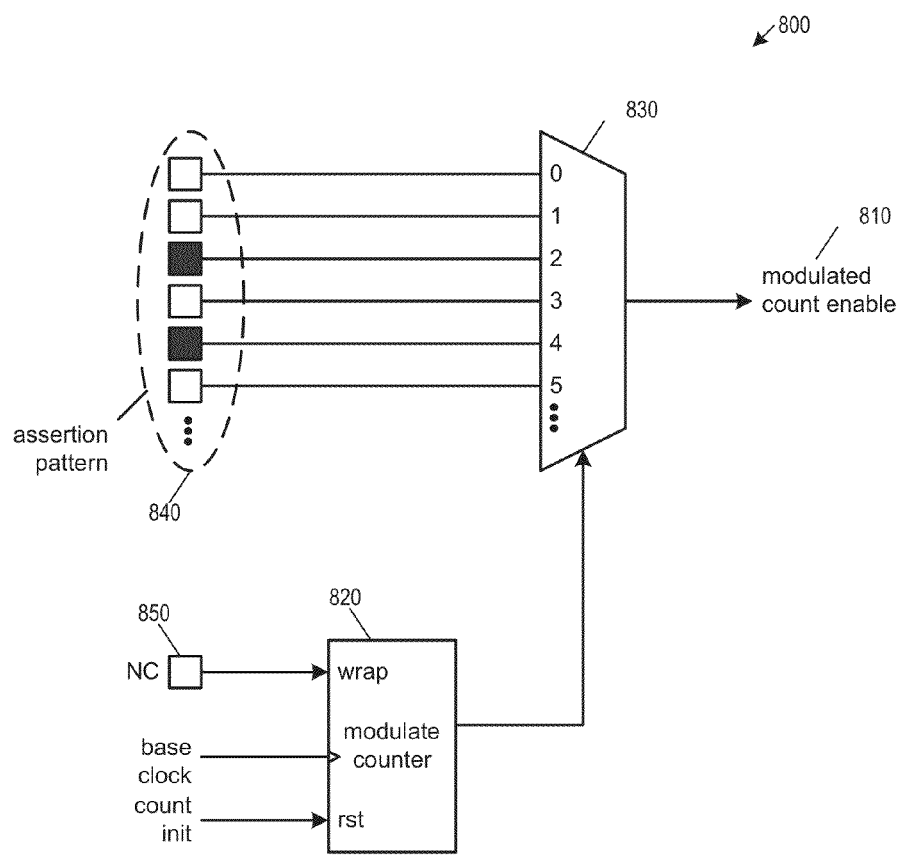
FIG. 8 conceptually illustrates a modulating circuit for generating a modulated counter enable signal.

For some embodiments, FIG. 8 conceptually illustrates a modulating circuit 800 for generating a modulated counter enable signal 810. The circuit 800 includes a modulating counter 820 and a multiplexer 830. The modulate counter 820 operates on the base clock and increments every base clock cycle. The counter 830 wraps around to its initial count (e.g., 0) whenever a terminal count 850 is reached. This terminal count corresponds to the number of base clock cycles in each recurring pattern (such as the NC fields 771-773). In some embodiments, the modulating counter 820 is reset to its initial count whenever the count init signal is generated for resetting the reconfiguration state.

The multiplexer 830 uses the count of the counter 820 to select from a number of pattern bits 840, each pattern bit determining whether the modulated count enable should be asserted in a particular cycle. These pattern bits correspond to the assertion pattern (such as the assertion pattern fields 761-763). In some embodiments, the terminal count 850 and the pattern bits 840 are derived from configuration bits that are settable by user.

For example, if NC is '5' (indicating that the modulated pattern for counter enable recur every 5 base clock cycles) and the assertion pattern 840 is "00101" (asserting module enable on cycle 2 and cycle 4), the counter 820 would repeat its count from 0 to 4 and the multiplexer 830 would produce a modulated counter enable signal 810 that is similar to the modulated counter enable signal 723, which assert counter enable twice every five clock cycles (M=2, N=5).

Figure 9:
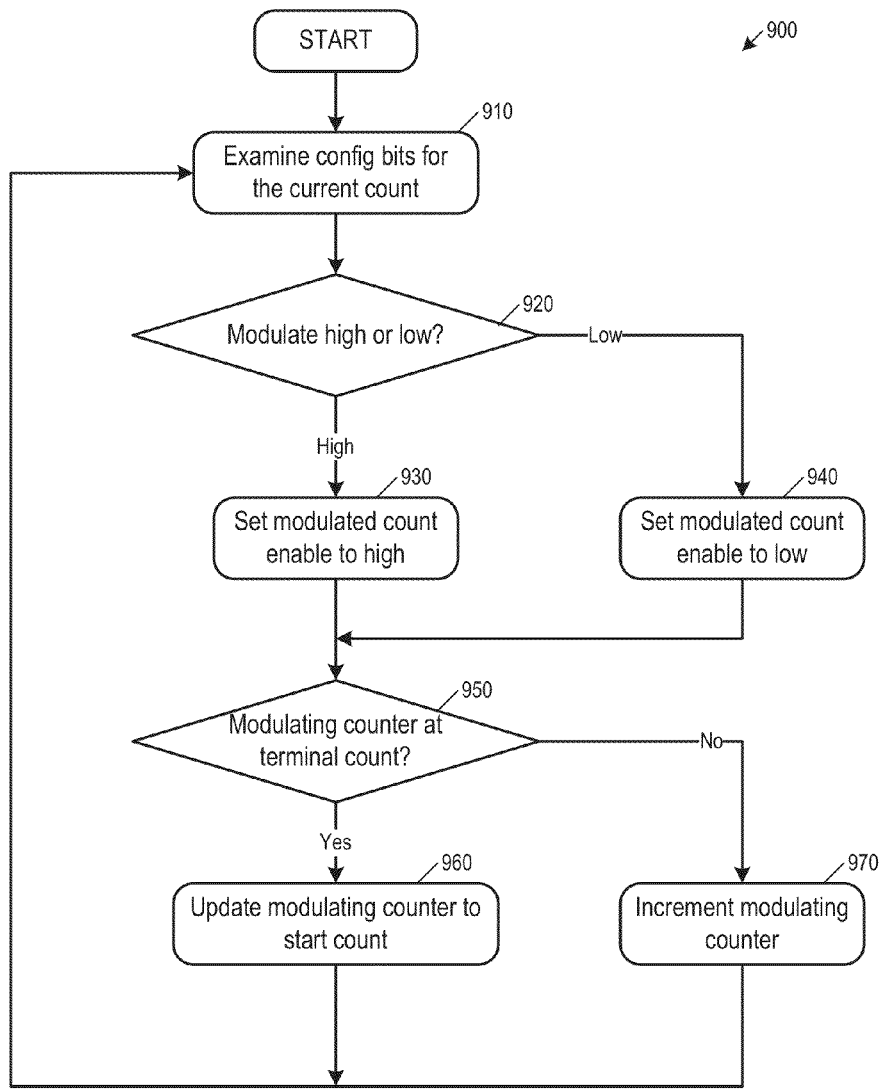
FIG. 9 conceptually illustrates a process for modulating the count enable signal.

FIG. 9 conceptually illustrates a process 900 for modulating the count enable signal. The process 900 maintains a modulating counter (such as the counter 820) and produces the modulated count enable signal based on the count of the counter and a set of configuration bits. The modulating counter operates on base clock (advancing counts on clock edge of the base clock).

The process examines (at 910) the set of configuration bits for the current count of the modulating counter. The process then determines (at 920) whether to modulate the modulated count enable signal to logic high or to logic low based the examination of the configuration bits. In some embodiments, there is a configuration bit for each count of the modulating counter, wherein each of such configuration bit determines whether to modulate the count enable signal to logic high or to logic low. In some other embodiments, individual configuration bits do not directly correspond to individual counts. For example, the configuration bits in some embodiments specify only that the counter enable signal should be asserted in M cycles out of N cycles, but does not specify in which cycles of the N cycles the modulated count enable signal should asserted. In some of these embodiments, the process 900 automatically determines whether to assert the modulated count enable signal in any particular count. Some of these embodiments spread the modulated count enable as evenly as possible. Based on this determination, the process either sets (at 930) the modulated count enable to logic high or sets (at 940) the modulated count enable to logic low.

The process then determines (at 950) whether the terminal count of the modulating counter has been reached. The terminal count corresponds to the number of base clock cycles in a recurring pattern of modulated count enable signal. For a recurring pattern with N cycles, the modulating counter starts count at 0 and end at N−1 as the terminal count. If terminal count has been reached, the process proceeds to 960 to update the modulating counter to the start count. If the terminal count has not been reached, the process proceeds to 970 to increment the modulating counter.

III. Static Scheduling of Cross Domain Signals

As mentioned, different clock domains having different effective user defined clocks can communicate with each other synchronously because the different user defined clocks are related by a common base clock. The common base clock drives the reconfigurable circuits of these different clock domains, as well as the reconfiguration state counters and the CMBs that modulate the count enable signals. As a result, the reconfiguration states of these different clock domains operate a common clock reference with controlled skew. In addition, the reconfiguration states of these different clock domains will be periodically and predictably aligned.

Figure 10:
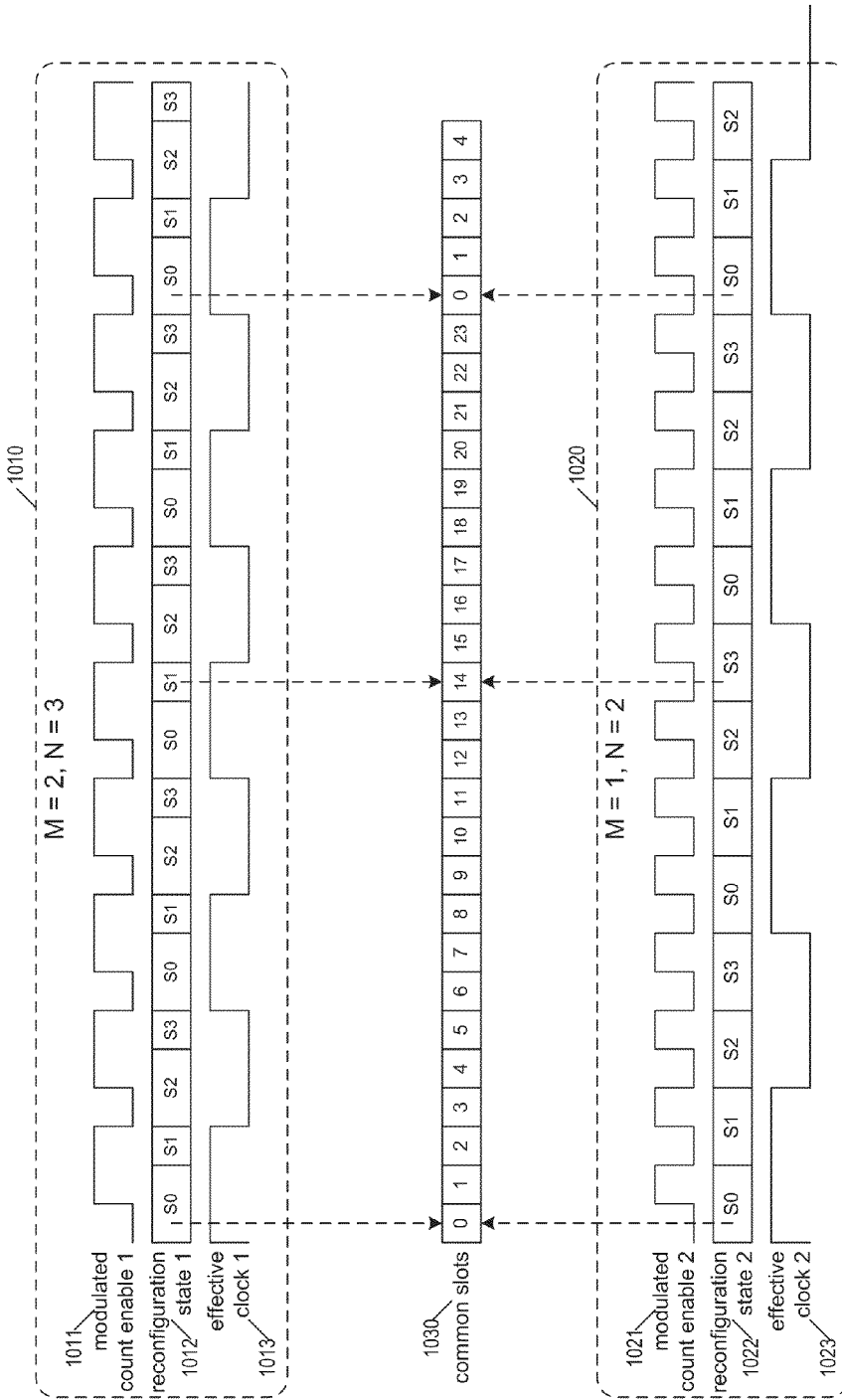
FIG. 10 illustrates the periodic alignment of reconfiguration states between clock domains having related clocks.

FIG. 10 illustrates the periodic alignment of reconfiguration states between clock domains having related user clocks. The figure illustrates two related clock domains 1010 and 1020 that are based on a common base clock. The two clock domains have same looperness (four, S0 thru S3), but their reconfiguration states are configured differently. The modulated count enable signal 1011 to the reconfiguration state 1012 of the clock domain 1010 asserts twice every three base clock cycles (M=2, N=3), while the modulated count enable signal 1021 to the reconfiguration state 1022 of the clock domain 1020 asserts once every two base clock cycles (M=1, N=2). The different count enable signals to the two different clock domains effectively implements two clocks 1013 and 1023 that are specified by the user design.

Though the two clocks 1013 and 1023 have different frequencies, their reconfiguration states do align periodically. In fact, any two clock domains with related clocks based on the same base clock will align periodically so that any signals traveling between any two such clock domains can be statically scheduled into slots that correspond to individual cycles of the base clock. As conceptually illustrated by common slots 1030, both the first reconfiguration state 1012 and the second reconfiguration state 1022 are at S0 once every 24 base clock cycles. Each of these 24 base clock cycles is a unique slot that always corresponds to the same pairing of reconfiguration states from the two clock domain. In some embodiments, the unique slot that corresponds to when both clock domains are at reconfiguration state S0 is designated to be the first slot or slot 0. Following this arbitrary designation, slot 14, for example, is always available for signal crossing when the reconfiguration state 1012 is at S1 and the reconfiguration state 1022 is S3. Such scheduling is "static" because it can be statically and predictably specified as part of the user design or configuration control bits. In other words, the timing of cross domain signaling need not be dynamically determined during real-time operation of the IC.

Figure 11:
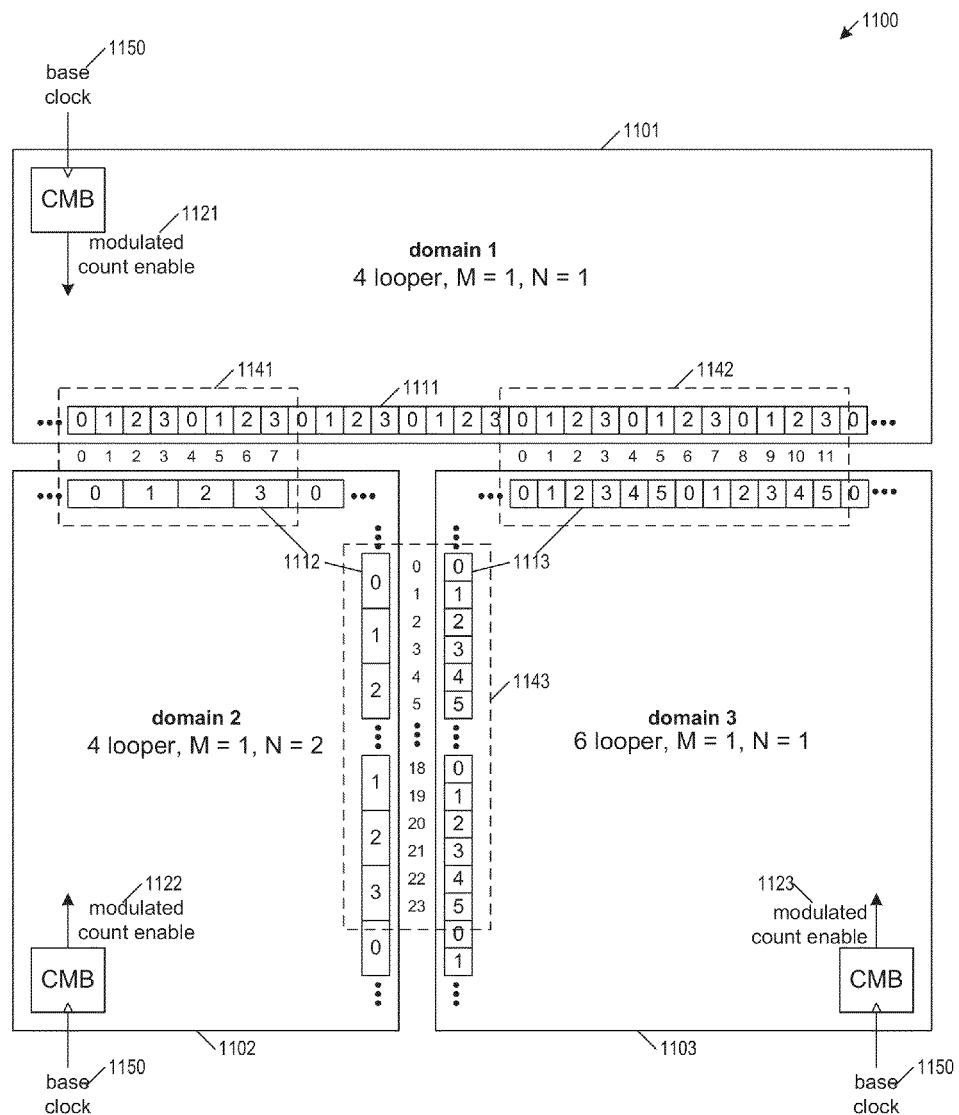
FIG. 11 illustrates the static scheduling of domain crossing signals between clock domains having related clocks.

FIG. 11 illustrates the static scheduling of domain crossing signals between clock domains having related clocks. FIG. 11 illustrates an IC 1100 with three different clock domains 1101, 1102, and 1103. The three clock domains are related by a common base clock 1150. The common base clock 1150 is used to operate the reconfigurable circuits in each of the three clock domains. The common base clock 1150 is also used to operate the CMBs that is supplying the modulated count enable signals to the clock domains. FIG. 11 also conceptually illustrates domain crossing interfaces 1141, 1142, and 1143.

The clock domain 1101 has 4-loopered reconfiguration state 1111. The count enable signal 1121 for the reconfiguration state 1111 is not modulated (M=1, N=1). The frequency of the effective clock of the clock domain 1101 is therefore ¼ of the base clock frequency. The reconfiguration state 1112 of the clock domain 1102 is also 4-loopered. The count enable signal 1122 for the reconfiguration state 1112 is modulated to assert once every two cycles (M=1, N=2). The frequency of the effective clock of the clock domain 1102 is therefore ½ *¼=⅛ of the base clock frequency. The clock domain 1103 has a 6-looper reconfiguration state 1113. The count enable signal 1123 for the reconfiguration state 1113 is not modulated (M=1, N=1). The frequency of the effective clock of the clock domain 1103 is therefore ⅙ of the base clock frequency.

The domain crossing interface 1141 conceptually illustrates static scheduling of domain crossing between clock domain 1101 and 1102. The two clock domains have the same looperness (4), but their count enable signals are modulated differently to effectively implement two clocks with different frequencies (¼ and ⅛ of base clock frequency). However, the reconfiguration states of the two clock domains repeat the same alignment once every 8 clock cycles. This means that there are 8 static scheduling slots. The IC design can, for example, specify a signal to cross from clock domain 1101 to clock domain 1102 on slot 3 and expect the reconfiguration state 1111 to be at 3 and the reconfiguration state 1112 to be at 1.

The domain crossing interface 1142 conceptually illustrates static scheduling of domain crossing between clock domain 1101 and 1103. Both clock domains have their count enable signals remain asserted, but the looperness of clock domain 1101 (4) and the looperness of the clock domain 1103 (6) are different so to effectively implement two clocks with different frequencies (¼ and ⅙ base clock frequency). However, the reconfiguration states of the two clock domains repeat the same alignment once every 12 clock cycles. This means that there are 12 static scheduling slots. The IC design can, for example, specify a signal to cross from clock domain 1101 to clock domain 1103 on slot 11 and expect the reconfiguration state 1111 to be at 3 and the reconfiguration state 1113 to be at 5.

The domain crossing interface 1143 conceptually illustrates static scheduling of domain crossing between clock domain 1102 and 1103. The two clock domains have different looperness, and their count enable signals are modulated differently. The frequencies of their respective effectively implemented clocks are ⅛ of base clock frequency ⅙ of base clock frequency. However, the reconfiguration states of the two clock domains repeat the same alignment once every 24 clock cycles. This means there are 24 static scheduling slots. The IC design can, for example, specify a signal to cross from clock domain 1102 to clock domain 1103 on slot 23 and expect the reconfiguration state 1112 to be at 3 and the reconfiguration state 1113 to be at 5.

Figure 12:
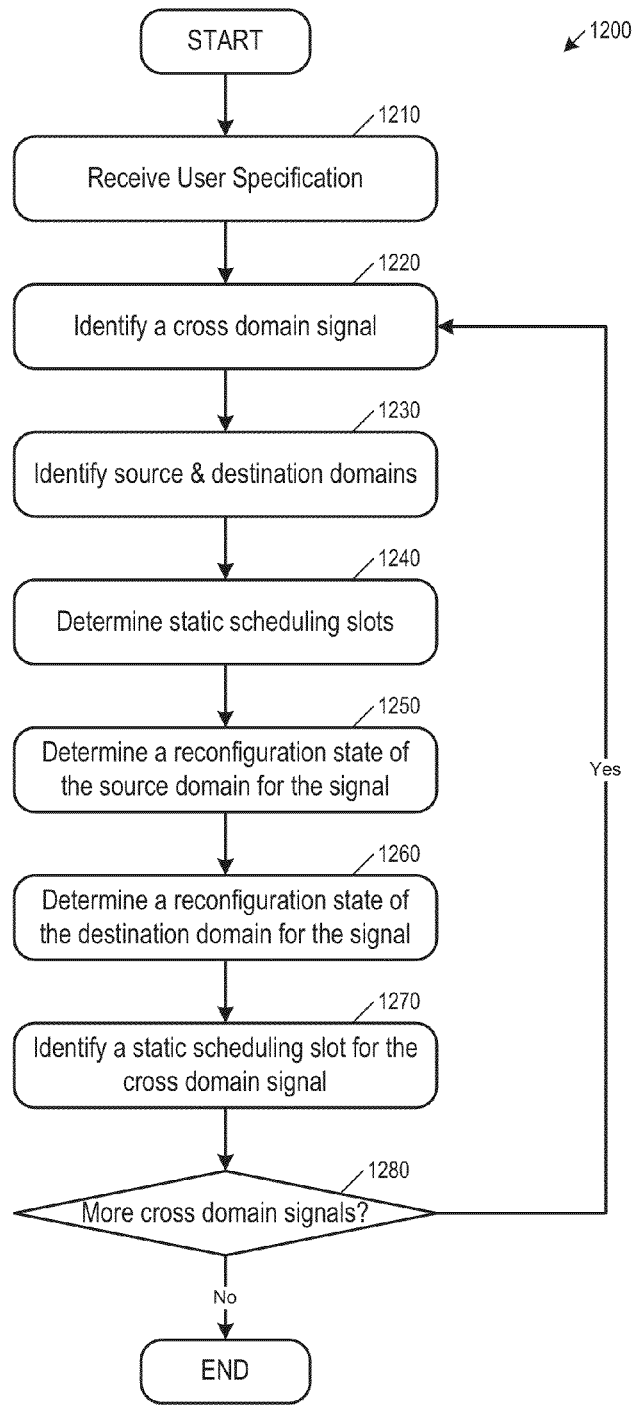
FIG. 12 conceptually illustrates a process for statically scheduling cross domain signals into static slots between related clock domains.

For some embodiments, FIG. 12 conceptually illustrates a process 1200 for statically scheduling cross domain signals into static slots between related clock domains. The process receives (at 1210) a user specification for an IC design. In some embodiments, this user specification includes hardware or circuit description (such as Verilog or VHDL), synthesis scripts, or other user specification of the functionalities of the IC design. Such specifications can include descriptions of circuits, signals, or behaviors of functional modules. Such specification also includes a specification that defines the frequency, latency, signal bandwidth, throughput and other characteristics of the clocked circuit(s).

The process next identifies (at 1220) a cross domain signal from the user specification of IC design. In some embodiments, this operation includes identifying signals whose source and destination storage elements are clocked by different clocks in the user design specification. The process then identifies (at 1230) the source clock domain and the destination clock domain of the identified cross domain signal. In some embodiments, the source domain is identified as the circuits or functionalities that are defined to operate on a first clock that sources the cross domain signal, while the destination domain is identified as the circuits or functionalities that are defined to operate on a second clock that receives the cross domain signal.

Next, the process determines (at 1240) static scheduling slots between the source and destination domains. This is done in some embodiments by identifying the least common multiple between the periods (i.e., 1/frequency) of the two user clocks. For example, the clock domain 1102 operate at ⅛ of frequency of the base clock, while the clock domain 1103 operate at ⅙ of frequency of the base clock. The least common multiple between 6 and 8 is 24, and therefore there are 24 static scheduling slots between clock domain 1102 and 1103.

The process then determines (at 1250) a reconfiguration state of the source domain for the cross domain signal. The process also determines (at 1260) a reconfiguration state of the destination domain for the cross domain signal. In some embodiments, circuit operations of the IC are decomposed and mapped into different reconfiguration states in order to be performed by reconfigurable circuits. The process 1200 in some embodiments identifies the reconfiguration state of the source circuit when it produces the cross domain signal and also the reconfiguration state of the destination circuit when it receives the cross domain signal.

After identifying the reconfiguration states of the source and destination domains, the process identifies (1270) a static scheduling slot for the cross domain signal based on the reconfiguration states of the source and destination domains.

The then determines (at 1280) if there are more cross domain signals to be statically schedules. If there are more cross domain signals, the process returns to 1220. Otherwise, the process 1200 ends.

IV. Aligning User Clock to Reference Signal

In some embodiments, the clocks that are effectively implemented by the loopering of reconfiguration states not only relate to each other by virtue of being derived from the same faster running base clock, but they are also related by aligning their reconfiguration states to a common reference signal. In some embodiments, CMBs that generates modulate count enable and count init signal receives a reference signal for aligning reconfiguration state with the reference clock. In some embodiments, the reference signal is a periodic signal that is also referred to as a reference clock. In some embodiments, a reference clock is provided by an external source for synchronizing the circuits in the IC with circuits outside of the IC. In some embodiments, phase lock loops (PLLs) of the IC receives reference clock in order to synchronize the clocks generated within the IC (such as the base clock and/or the user defined clocks) with the reference clock.

Figure 13:
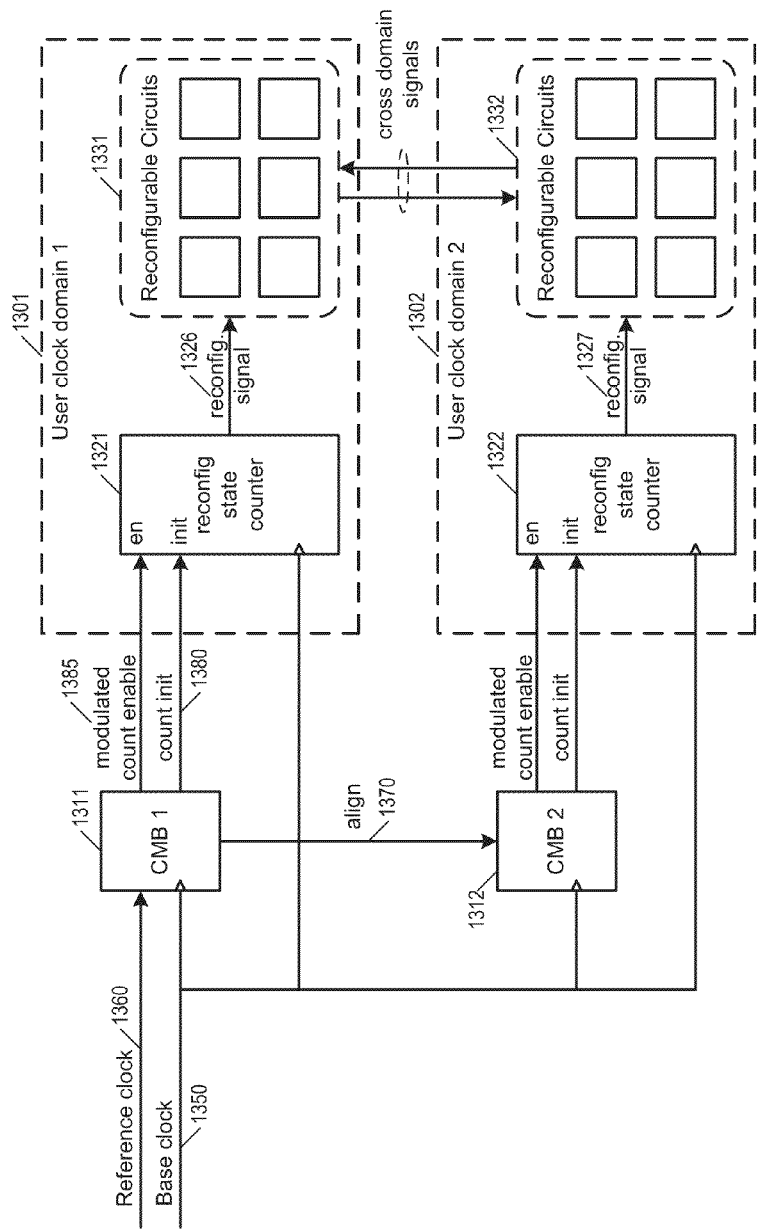
FIG. 13 illustrates an IC that includes multiple clock domains with reconfiguration states that are aligned by a same reference clock.

FIG. 13 illustrates an IC 1300 that includes multiple clock domains with reconfiguration states that are aligned by a same reference clock. The IC 1300 is similar to the IC 200 and includes clock domains 1301 and 1302, which are controlled by clock management blocks (CMBs) 1311 and 1312, respectively. The clock domain 1301 includes a reconfiguration counter 1321 and reconfigurable circuits 1331. The clock domain 1302 includes a reconfiguration counter 1322 and reconfigurable circuits 1332. The circuits included in the clock domains 1301 and 1302 as well as circuits in CMBs 1311 and 1312 all operate on a common base clock 1350. The reconfiguration counter 1321 and 1331 maintains the reconfiguration states of the clock domains 1301 and 1321, respectively. The clock domain 1301 receives its reconfiguration state from the reconfiguration signal 1326, while the clock domain 1302 receives its reconfiguration state from the reconfiguration signal 1327.

Unlike the IC 200, one of the CMBs (1311) in the IC 1300 also receives a reference clock 1360.

The CMB 1311 generates the count init signal 1380 to the clock domain 1301 based on active edge (can be rising or falling edge) of the reference clock 1360. The count init signal, causes the reconfiguration state 1326 (as delivered by the reconfiguration signal 1326) to go to a starting or initial reconfiguration state. The generation of the count init signal 1380 also causes the modulation of the count enable signal 1385 to reset as discussed above by reference to FIG. 8. In some embodiments, the CMB 1311 generates the count init signal whenever it detects a rising (or falling edge) on the reference clock.

The detection of the active edge of reference clock CMB 1311 also generates an "align" signal 1370 to the other CMB 1312. The generation of the "align" signal 1370 allows the reconfiguration state of the clock domain 1302 to align with the reconfiguration state of the clock domain 1301. In some embodiments, the CMB 1312 uses the received "align" signal to generate its own count init signal as well as resetting its count enable modulation.

In some embodiments, the CMB 1311, the reference clock 1360 is not a periodic signal. It is rather a reference signal that may or may not have predictable periods. Some embodiments nevertheless use the active edge of this reference signal for aligning the reconfiguration state (and hence the clocks that are effectively implemented by the reconfiguration state). Such reference signal can be clock, a hand shake signal on an interface with another chip, a memory access indication, a pulse, or any other types of signal in an electronic system that includes the IC.

Figure 14:
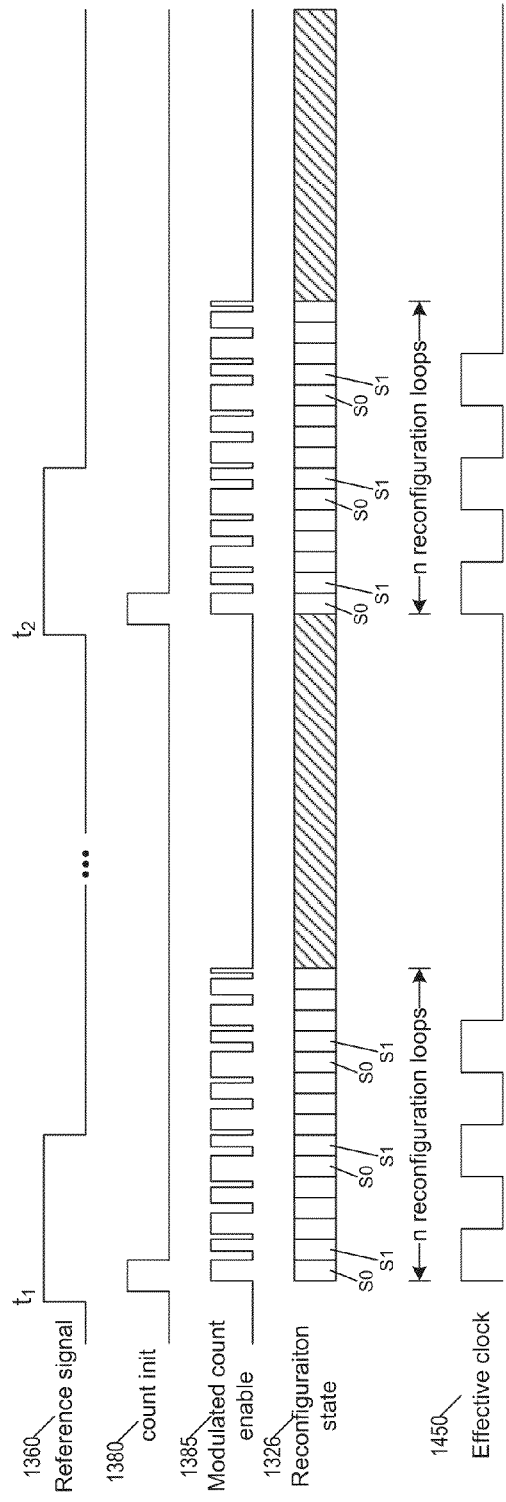
FIG. 14 illustrates the use of a reference signal for aligning the reconfiguration state of a clock domain.

FIG. 14 illustrates the use of a reference signal for aligning the reconfiguration state 1326 of the clock domain 1301. The reference signal 1360 can be a periodic reference clock as illustrated in FIG. 13, but it can also be a non-periodic signal (e.g., a pulse) that does not exhibit properties of a clock. FIG. 14 illustrates a waveform 1400 that includes the reference signal 1360 (or the reference clock), the count init signal 1380, the modulated count enable signal 1385, and reconfiguration state 1326. The reference signal 1360 is a pulse signal that is active high.

Before detecting or receiving a pulse on the reference signal 1360, the reconfiguration state 1326 and the modulated count enable signal 1385 are not aligned with reference signal 1360. In some embodiments, the count enable signal 1385 is not asserted (and hence reconfiguration state does not advance) until a pulse on the reference signal 1360 has been received.

Upon detecting such a pulse (e.g., by detecting a rising edge if the pulse is active high), the CMB 1311 asserts count reset 1380 (and align signal 1370), which causes the reconfiguration state 1326 to be set to the starting reconfiguration state (S0). The detection of the pulse starts the modulation of the count enable signal 1385, which in turn allows reconfiguration state 1326 to advance. The advancement of the reconfiguration state effectively implements clock 1450.

In some embodiments, each detected pulse of reference signal enables the reconfiguration state to run for a limited time interval. Once that limited time interval has expired, the count enable signal de-asserts and the reconfiguration state will not advance (and hence the reconfigurable circuit will not operate). As illustrated, upon the detection of the reference signal pulse at time $t_1$, the modulated count enable is active (i.e., modulated or remain asserted) for a specified number of reconfiguration loops (each loop being from first reconfiguration state to the last reconfiguration state) to allow the reconfigurable circuits to complete the specified number of loops of operation. Once these loops of reconfiguration has completed, the modulated count enable signal de-asserts, and the reconfiguration state stops advancing and the reconfigurable circuits stops operating. The reconfigurable circuits remain inactive until the detection of another pulse on the reference signal 1360 at $t_2$, which once again activates the modulation of the count enable signal 1385. The reconfiguration state will once again advance for several reconfiguration loops to allow the reconfigurable circuits to operate before stopping.

The number of reconfiguration loops that is completed following each reference signal pulse may be determined by user in some embodiments. In some embodiments, the duration of operation following each detected pulse on the reference signal is specified by referencing time units other than the number of reconfiguration loops.

V. Reconfigurable Circuits

Reconfigurable ICs are one type of configurable ICs. A reconfigurable IC is a configurable IC that includes configurable circuits that can be reconfigured during runtime. A reconfigurable IC typically includes reconfigurable logic circuits and/or reconfigurable interconnect circuits. A configurable logic or interconnect circuit is said to reconfigure when it receives a different set of configuration data for the configurable logic or interconnect circuit to perform a different user defined function in a new clock cycle.

Figure 15:
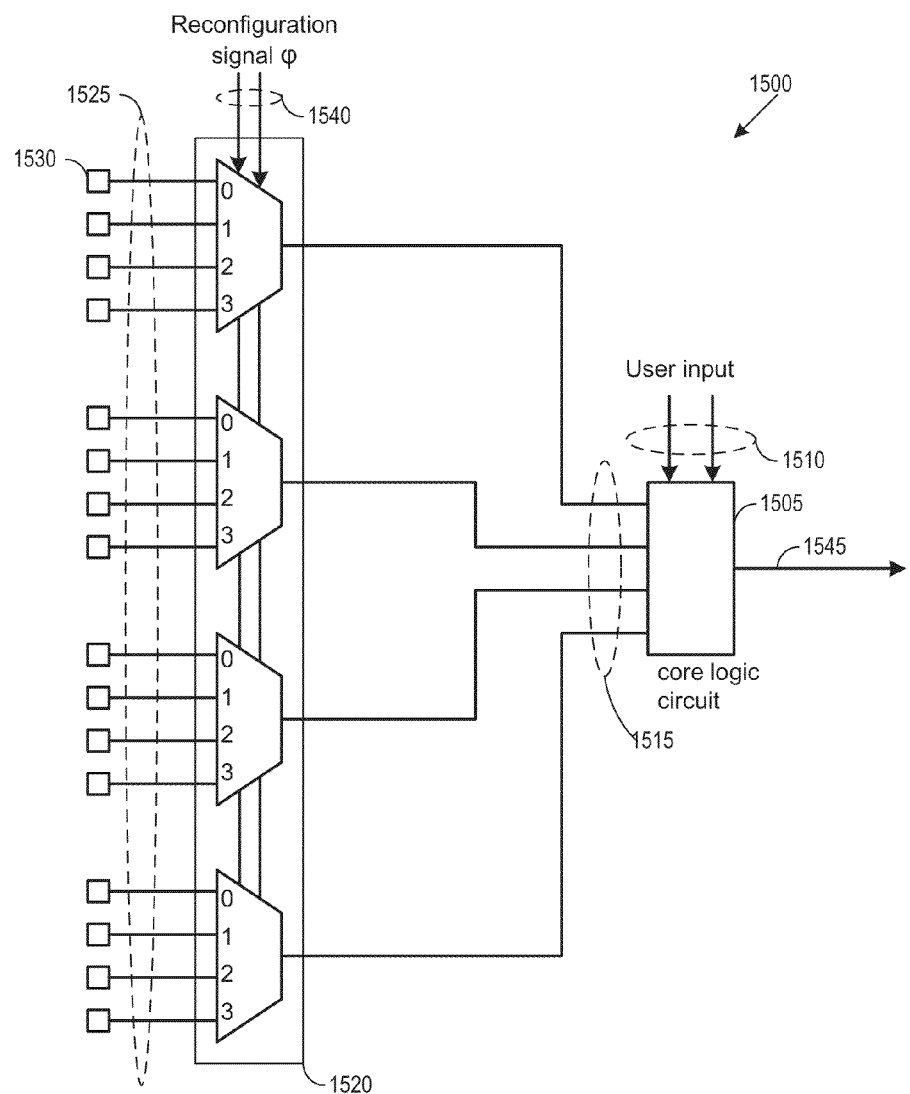
FIG. 15 illustrates an example of a reconfigurable logic circuit.

FIG. 15 illustrates an example of a reconfigurable logic circuit 1500. This logic circuit includes a core logic circuit

1505 that can perform a variety of functions based on a set of input data 1510 that it receives. The core logic circuit 1505 also receives a set of four configuration data bits 1515 through a switching circuit 1520. The switching circuit receives a larger set of sixteen configuration data bits 1525 that are stored in a set of storage elements 1530 (e.g., a set of memory cells, such as SRAM cells). This switching circuit is controlled by a two-bit reconfiguration signal φ through two select lines 1540. Whenever the reconfiguration signal changes, the switching circuit supplies a different set of configuration data bits to the core logic circuit 1505. The configuration data bits then determine the function that the logic circuit 1505 performs on its input data. The core logic circuit 1505 then outputs the result of this function on the output terminal set 1545.

Any number of known logic circuits (also called logic blocks) can be used in conjunction with the invention. Examples of such known logic circuits include look-up tables (LUT's), universal logic modules (ULM's), sub-ULM's, multiplexers, and PAL's/PLA's. In addition, logic circuits can be complex logic circuits formed by multiple logic and interconnect circuits. Examples of simple and complex logic circuits can be found Architecture and CAD for Deep-Submicron FPGAs, Betz, et al., ISBN 0792384601, 1999, and Design of Interconnection Networks for Programmable Logic, Lemieux, et al., ISBN 1-4020-7700-9, 2003. Other examples of reconfigurable logic circuits are provided in U.S. Pat. No. 7,157,933, entitled "Configurable Circuits, IC's, and Systems."

Figure 16:
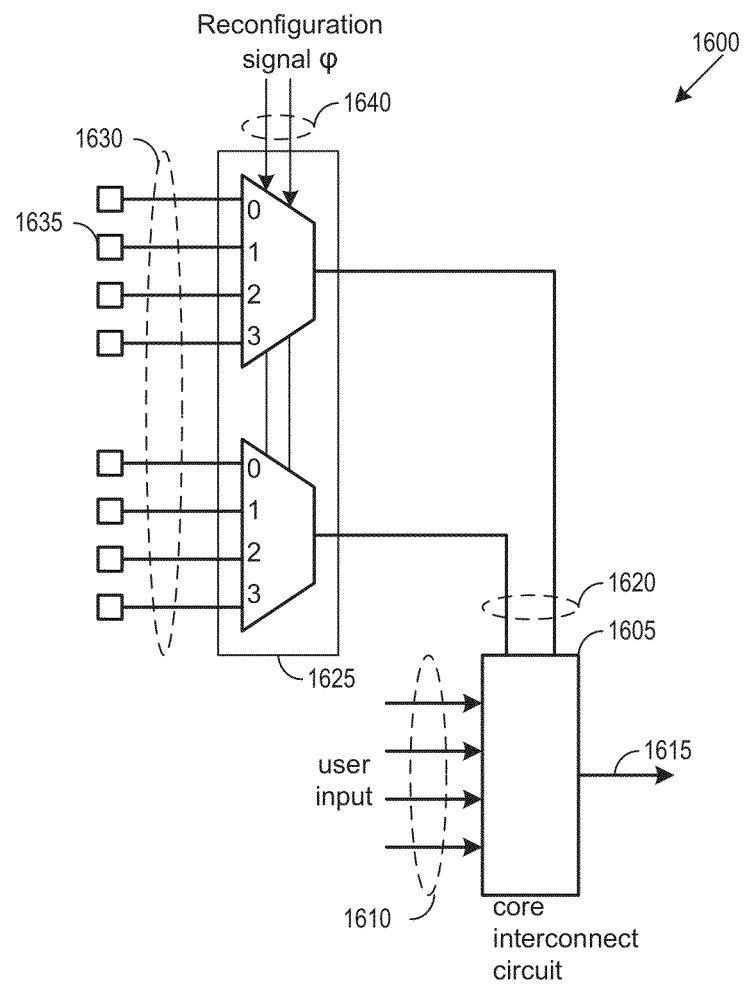
FIG. 16 illustrates an example of a reconfigurable interconnect circuit.

FIG. 16 illustrates an example of a reconfigurable interconnect circuit 1600. This interconnect circuit includes a core interconnect circuit 1605 that connects an input data terminals 1610 to an output data terminal set 1615 based on a configuration data set 1620 that it receives from a switching circuit 1625. The switching circuit 1625 receives a larger set of configuration data bits 1630 that are stored in a set of storage elements 1635 (e.g., a set of memory cells, such as SRAM cells). This switching circuit is controlled by a two-bit reconfiguration signal φ through two select lines 1640. Whenever the reconfiguration signal changes, the switching circuit supplies a different set of configuration data bits to the core interconnect circuit 1605. The configuration data bits then determine the connection scheme that the interconnect circuit 1605 uses to connect the input and output terminals 1610 and 1615.

Any number of known interconnect circuits (also called interconnects or programmable interconnects) can be used in conjunction with the invention. Examples of such interconnect circuits include switch boxes, connection boxes, switching or routing matrices, full- or partial-cross bars, etc. Such interconnects can be implemented using a variety of known techniques and structures. Examples of interconnect circuits can be found Architecture and CAD for Deep-Submicron FPGAs, Betz, et al., ISBN 0792384601, 1999, and Design of Interconnection Networks for Programmable Logic, Lemieux, et al., ISBN 1-4020-7700-9, 2003. Other examples of reconfigurable interconnect circuits are provided in the U.S. Pat. No. 7,157,933.

As mentioned above, the logic and interconnect circuits 1500 and 1600 each receive a reconfiguration signal φ. In some embodiments, this signal is a sub-cycle signal that allows the circuits 1500 and 1600 to reconfigure on a sub-cycle basis, i.e., to reconfigure one or more times within a cycle of a primary clock. In some embodiments, each sub-cycle correspond to a cycle of the base clock. The primary clock might be a design clock for which the user specifies a design (hence also called a user clock). For instance, when the design is a Register Transfer Level (RTL) design, the design clock rate can be the clock rate for which the user specifies his or her design in a hardware definition language (HDL), such as VHDL or Verilog. Alternatively, the primary clock might be an interface clock that defines the rate of input to and/or output from the IC (e.g., the rate that the fastest interface circuit of the IC passes signals to and/or receives signals from circuits outside of the IC). In some embodiments, the primary clock is based on a reference clock input to a PLL that sources the base clock.

Figure 17:
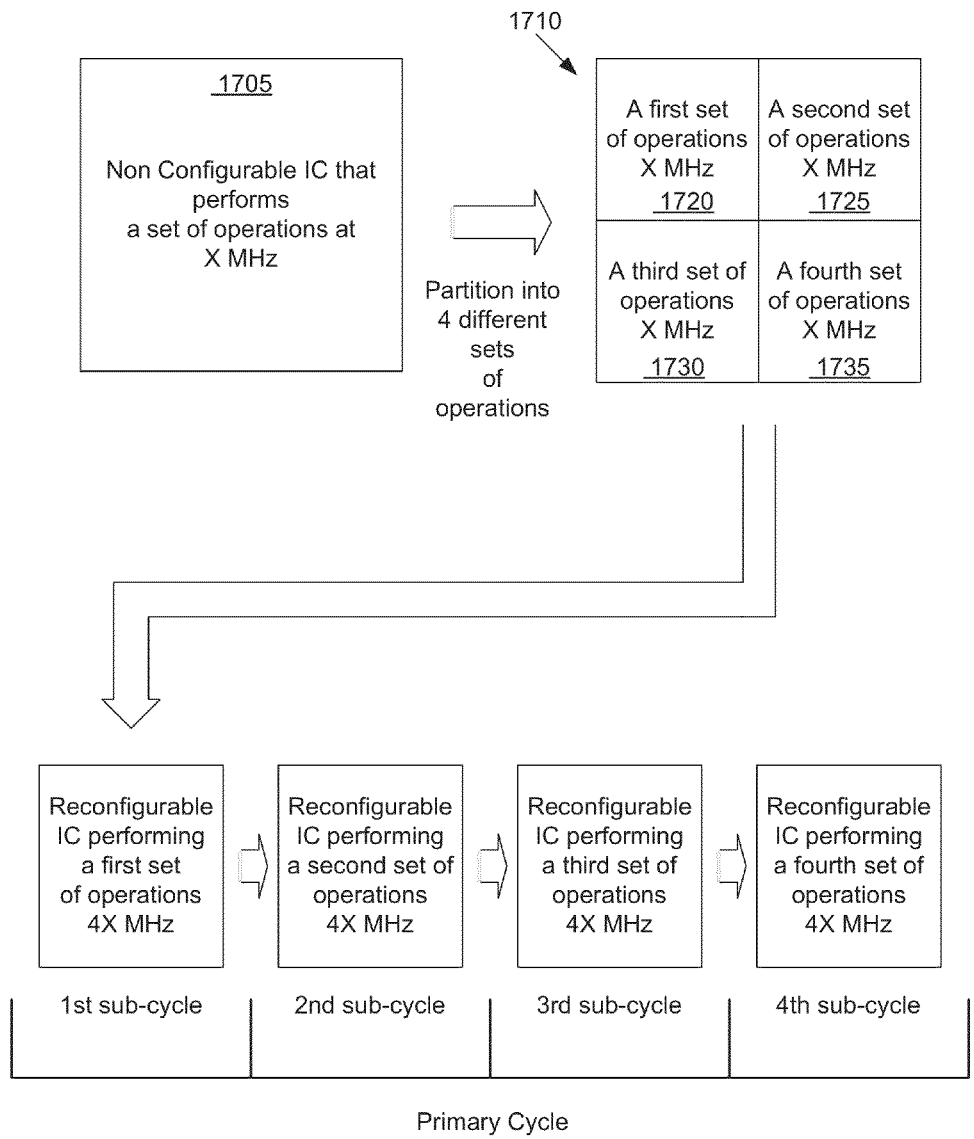
FIG. 17 conceptually illustrates an example of a reconfigurable IC that reconfigures every cycle of the base clock.

FIG. 17 conceptually illustrates an example of a reconfigurable IC that reconfigures every cycle of the base clock, where each base clock cycle correspond to a sub-cycle of a primary clock (or user clock). In this example, the reconfigurable IC implements an IC design 1705 that is defined to operate at a clock speed of X MHz. The operations performed by the components in the IC design 1705 are partitioned into four sets of operations 1720-1735.

These four sets of operations 1720-1735 are performed by the reconfigurable IC 1710 that operates at 4× MHz (i.e., the base clock). In some embodiments, four cycles of the 4× MHz clock correspond to four sub-cycles within a cycle of the X MHz clock. Accordingly, this figure illustrates the reconfigurable IC 1710 reconfiguring four times during four cycles of the 4× MHz clock (i.e., during four sub-cycles of the X MHz clock). During each of these reconfigurations, the reconfigurable IC 1710 performs one of the identified four sets of operations 1720-1735. In other words, the faster operational speed of the reconfigurable IC 1710 allows this IC to reconfigure four times during each cycle of the X MHz clock, in order to perform the four sets of operations 1720-1735 sequentially at a 4× MHz rate instead of performing the four sets of operations in parallel at an X MHz rate. In some embodiments, a reconfigurable circuit receives its four different configuration data sets sequentially in an order that loops from the last configuration data set to the first configuration data set. Such a sequential reconfiguration scheme is referred to as a 4-loopered scheme. Higher order loopered schemes (e.g., 8, 12, 16, 32, etc.,) can likewise be implemented as discussed above by reference to FIGS. 3-5 and 10-11.

While the reconfigurable circuits described in FIG. 17 are reconfigure in sub-cycles of a user design clock cycle, one of ordinary skill in the art will understand that in some embodiments, the reconfiguration cycles are not part of a larger user design clock cycle. Accordingly, any features described herein as using sub-cycles can also be implemented in some embodiments with reconfiguration cycles that are not sub-cycles of a longer user design clock cycle. In some such embodiments, multiple reconfigurations of the reconfigurable circuits are performed cyclically based on a reconfiguration clock cycle. In some such embodiments, some reconfigurable circuits reconfigure sequentially through a sequence of configurations over the course of multiple reconfiguration cycles, and then repeat the sequence of configurations multiple times.

In some embodiments, reconfigurable circuits in the IC are organized into clock domains, and each clock domain controlled by a clock management block (CMB). In some embodiments, each CMB-controlled clock domain provides a clock to one or more reconfigurable circuits that form the IC's configurable circuit fabric. For some embodiments, the configurable circuits in the fabric are organized into tiles, where each tile can be configured to operate in one of several clock domains as discussed above by reference to FIG. 2.

Figure 18:
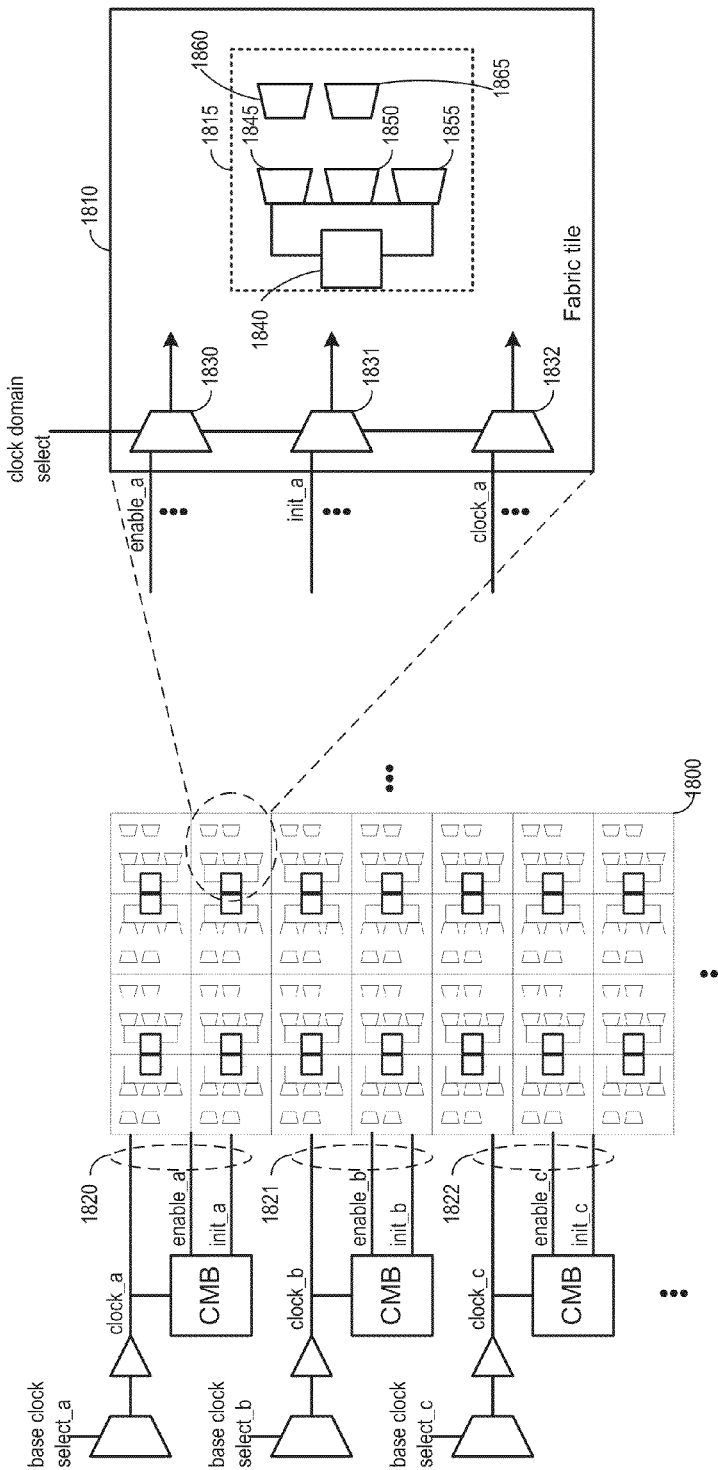
FIG. 18 illustrates a fabric of configurable circuits.

FIG. 18 illustrates a fabric 1800 of configurable circuits. The fabric 1800 includes a two-dimensional array of fabric tiles such as tile 1810. Each fabric tile includes a set of configurable logic circuit such as 1815. In some embodiments, the configurable circuit 1815 includes configurable logic circuits and configurable interconnect circuits. In the illustrated example, the configurable logic circuits and configurable interconnect circuits include a three-input LUT 1840, three input-select multiplexers 1845, 1850 and 1855, and two routing multiplexers 1860 and 1865. Configurable tiles in some embodiments can include other types of circuits, such as memory arrays.

Each fabric tile such as tile 1810 also includes multiplexers 1830-1832 for selecting count enable, count init and the base clock signals from one of the several clock domains 1820-1822. In some of these embodiments, the three-input LUT 1840, the input-select multiplexers 1845, 1850 and 1855 and the routing multiplexers 1860 and 1865 are all real-time, sub-cycle reconfigurable circuits. In some of these embodiments, the configurable IC stores multiple sets of configuration data for a reconfigurable circuit, so that the reconfigurable circuit can use different sets of configuration data in different cycles of the base clock.

Figure 19:
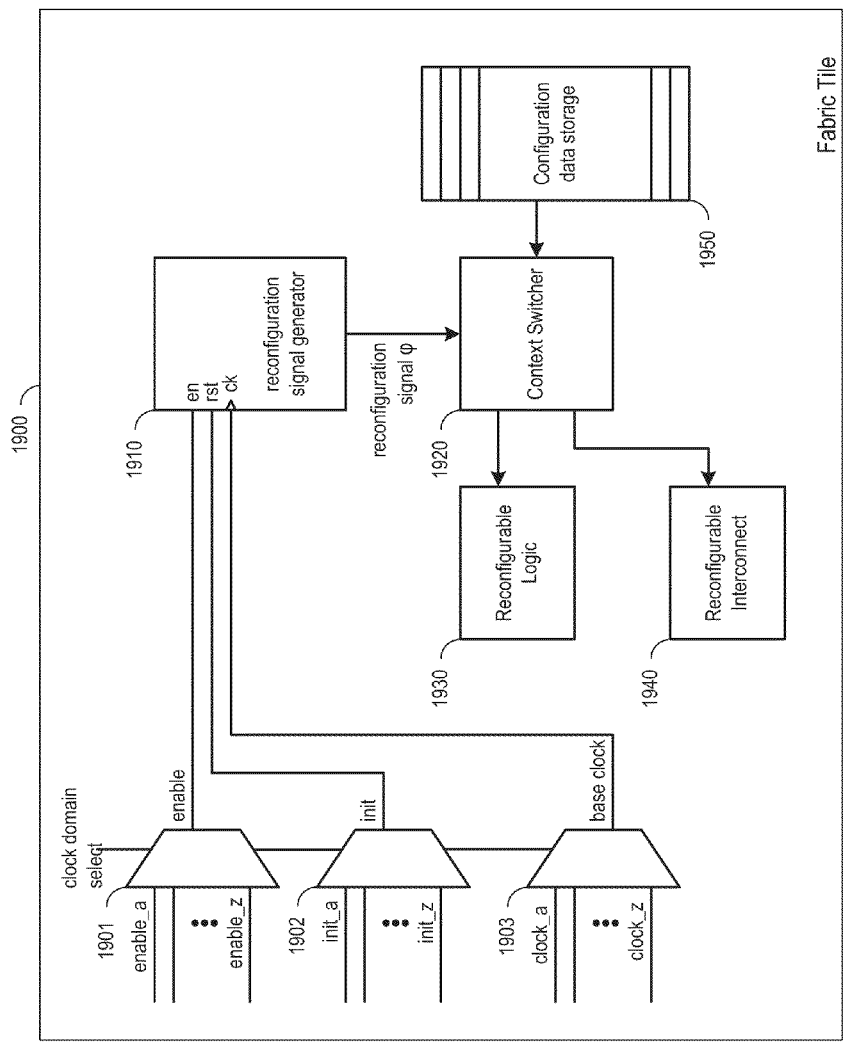
FIG. 19 illustrates an example fabric tile having a local reconfiguration signal generator.

In some embodiments, each tile has its own local reconfiguration signal generator so that different tiles can operate and reconfigure in different clock domains. FIG. 19 illustrates an example fabric tile 1900 having a local reconfiguration signal generator 1910. The fabric tile also includes a context switcher 1920, a reconfigurable logic circuit 1930, a reconfigurable interconnect circuit 1940 and a configuration data storage 1950. Similar to fabric tile 1810 of FIG. 18, the fabric tile 1900 also includes multiplexers 1901-1903 for selecting enable, init and clock signals from one of the clock domains.

The reconfiguration signal generator 1910 generates a reconfiguration signal φ to the context switcher 1920, which uses the reconfiguration signal to load different configuration data set from configuration storage 1950 to reconfigure the reconfigurable logic circuit 1930 and reconfigurable interconnect circuit 1940 on every sub-cycle. The operations of the reconfigurable logic and interconnect circuit are discussed above by reference to FIGS. 15-16.

In some embodiments, the reconfiguration signal generator 1910 includes a reconfiguration counter that increments once every cycle of the base clock for maintaining the reconfiguration state of the reconfigurable circuits. In the example of FIG. 19, the base clock used to increment the reconfiguration counter is the clock from the clock domain selected by the multiplexer 1903. In some of these embodiments, the reconfiguration counter halts and ceases to increment when the count enable signal from the selected clock domain or CMB is de-asserted. The reconfiguration counter resets to a pre-defined value (e.g., zero) when the init signal from the selected clock domain or CMB is asserted. Some of these embodiments use the init and enable signals to align the reconfiguration signal generation by lifting the reset signal (de-asserting init) and re-enabling the reconfiguration counter at the appropriate time. The control of the reconfiguration state (or reconfiguration signal generation) is described above in Sections I, II and IV.

VI. Configurable IC and System

Some embodiments described above are implemented in configurable ICs that can compute configurable combinational digital logic functions on signals that are presented on the inputs of the configurable ICs. In some embodiments, such computations are stateless computations (i.e., do not depend on a value of a previous state). Some embodiments described above are implemented in configurable ICs that can perform a continuous function. In these embodiments, the configurable IC can receive a continuous function at its input, and in response, provide a continuous output at one of its outputs.

Figure 20:
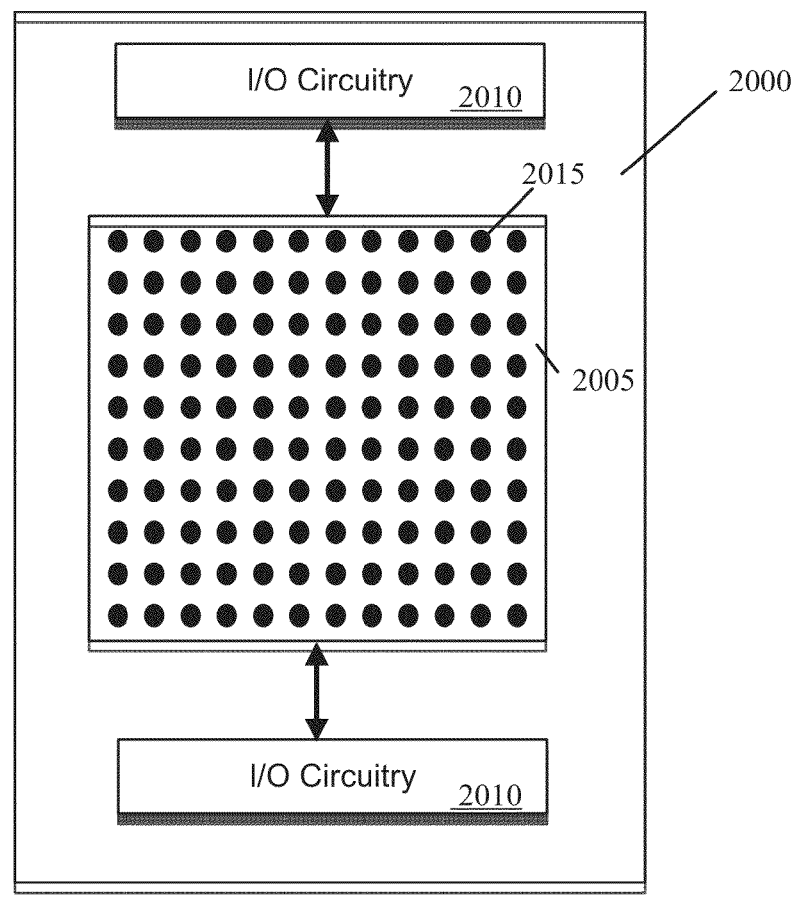
FIG. 20 illustrates a portion of a configurable IC.

FIG. 20 illustrates a portion of a configurable IC 2000 of some embodiments of the invention. As shown in this figure, this IC has a configurable circuit arrangement 2005 and I/O circuitry 2010. The configurable circuit arrangement 2005 can include any of the above described circuits, storage elements, and routing fabric of some embodiments of the invention. The I/O circuitry 2010 is responsible for routing data between the configurable nodes 2015 of the configurable circuit arrangement 2005 and circuits outside of this arrangement (i.e., circuits outside of the IC, or within the IC but outside of the configurable circuit arrangement 2005). As further described below, such data includes data that needs to be processed or passed along by the configurable nodes.

Figure 21:
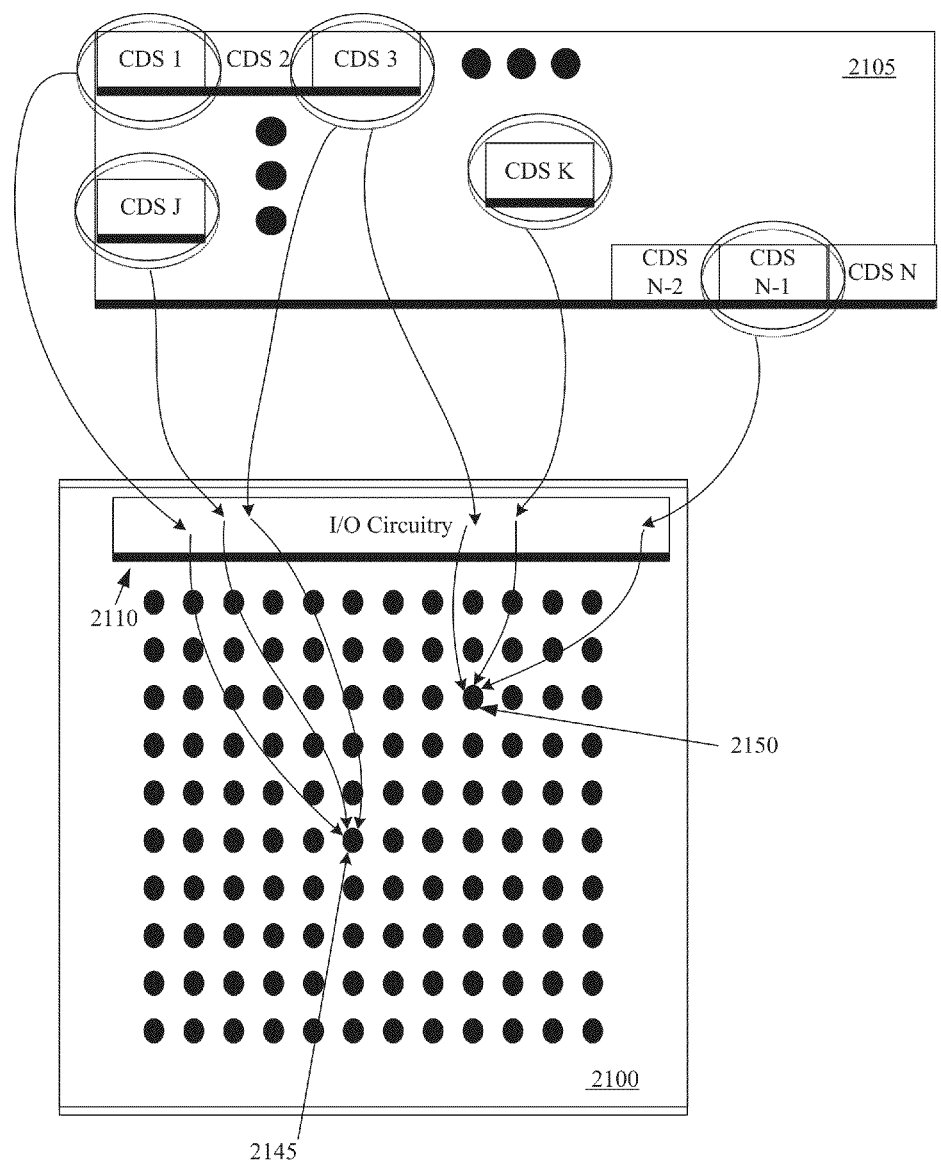
FIG. 21 illustrates a configuration data pool for a configurable IC.

The data also includes, in some embodiments, a set of configuration data for configuring the nodes to perform particular operations. FIG. 21 illustrates a detailed example of this. Specifically, this figure illustrates a configuration data pool 2105 for the configurable IC 2100. This pool includes N configuration data sets ("CDS"). As shown in FIG. 21, the I/O circuitry 2110 of the configurable IC 2100 routes different configuration data sets to different configurable nodes of the IC 2100. For instance, FIG. 21 illustrates configurable node 2145 receiving configuration data sets 1, 3, and J, through the I/O circuitry, while configurable node 2150 receives configuration data sets 3, K, and N−1, through the I/O circuitry. In some embodiments, the configuration data sets are stored within each configurable node. Also, in some embodiments, a configurable node can store multiple configuration data sets for a configurable circuit so that the circuit can reconfigure quickly by changing to another configuration data set for a configurable circuit. In some embodiments, some configurable nodes store only one configuration data set, while other configurable nodes store multiple configuration data sets for a configurable circuit.

Figure 22:
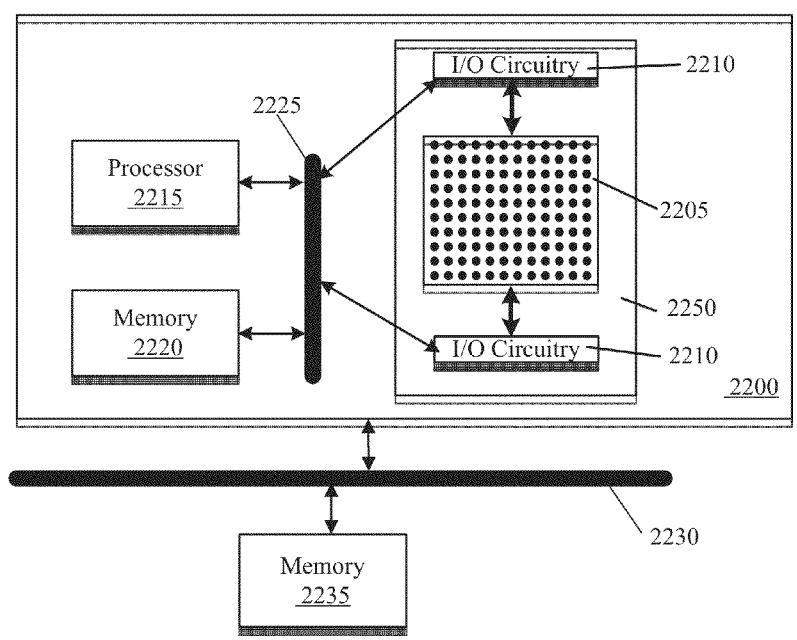
FIG. 22 illustrates a system on a chip ("SoC") implementation of a configurable IC.

A configurable IC of the invention can also include circuits other than a configurable circuit arrangement and I/O circuitry. For instance, FIG. 22 illustrates a system on a chip ("SoC") implementation of a configurable IC 2200. This IC has a configurable block 2250, which includes a configurable circuit arrangement 2205 and I/O circuitry 2210 for this arrangement. It also includes a processor 2215 outside of the configurable circuit arrangement, a memory 2220, and a bus 2225, which conceptually represents all conductive paths between the processor 2215, memory 2220, and the configurable block 2250. As shown in FIG. 22, the IC 2200 couples to a bus 2230, which communicatively couples the IC to other circuits, such as an off-chip memory 2235. Bus 2230 conceptually represents all conductive paths between the system components.

The processor 2215 can read and write instructions and/or data from an on-chip memory 2220 or an off-chip memory 2235. The processor 2215 can also communicate with the configurable block 2250 through memory 2220 and/or 2235 through buses 2225 and/or 2230. Similarly, the configurable block can retrieve data from and supply data to memories 2220 and 2235 through buses 2225 and 2230.

Figure 23:
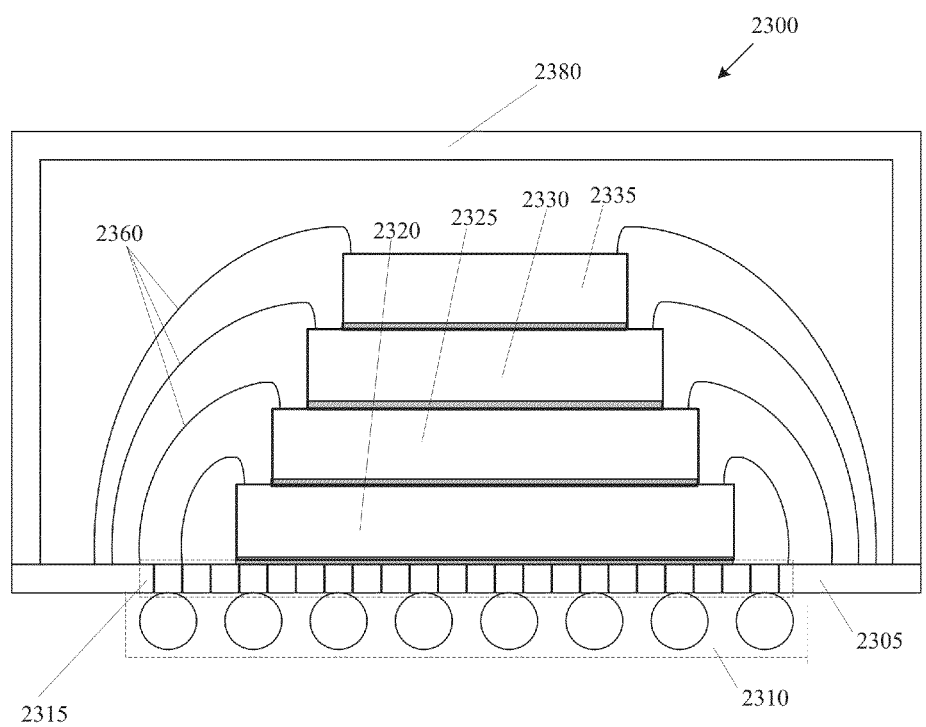
FIG. 23 illustrates a system in a package ("SiP") implementation for a configurable IC.

Instead of, or in conjunction with, the system on a chip ("SoC") implementation for a configurable IC, some embodiments might employ a system in a package ("SiP") implementation for a configurable IC. FIG. 23 illustrates one such SiP 2300. As shown in this figure, SiP 2300 includes four ICs 2320, 2325, 2330, and 2335 that are stacked on top of each other on a substrate 2305. At least one of the ICs is a configurable IC that includes a configurable block, such as the configurable block 2250 of FIG. 22. Other ICs might be other circuits, such as processors, memory, etc.

As shown in FIG. 23, the IC communicatively connects to the substrate 2305 through wire bondings 2360. These wire bondings 2360 allow the ICs 2320-2335 to communicate with each other without having to go outside of the SiP 2300. In some embodiments, the ICs 2320-2335 might be directly wire-bonded to each other in order to facilitate communication between the ICs. Instead of, or in conjunction with the wire bondings 2360, some embodiments might use other mechanisms to communicatively couple the ICs 2320-2335 to each other.

As further shown in FIG. 23, the SiP includes a ball grid array ("BGA") 2310 and a set of vias 2315. The BGA 2310 is a set of solder balls that allows the SiP 2300 to be attached to a printed circuit board ("PCB"). Each via connects a solder ball in the BGA 2310 on the bottom of the substrate 2305, to a conductor on the top of the substrate 2305.

The conductors on the top of the substrate 2305 are electrically coupled to the ICs 2320-2335 through the wire bondings 2360. Accordingly, the ICs 2320-2335 can send and receive signals to and from circuits outside of the SiP 2300 through the wire bondings 2360, the conductors on the top of the substrate 2305, the set of vias 2315, and the BGA 2310. Instead of a BGA, other embodiments might employ other structures (e.g., a pin grid array) to connect a SiP to circuits outside of the SiP. As shown in FIG. 23, a housing 2380 encapsulates the substrate 2305, the BGA 2310, the set of vias 2315, the ICs 2320-2335, and the wire bondings 2360 to form the SiP 2300. This and other SiP structures are further described in U.S. Pat. No. 7,530,044 entitled "Method for Manufacturing a Programmable System In Package".

Figure 24:
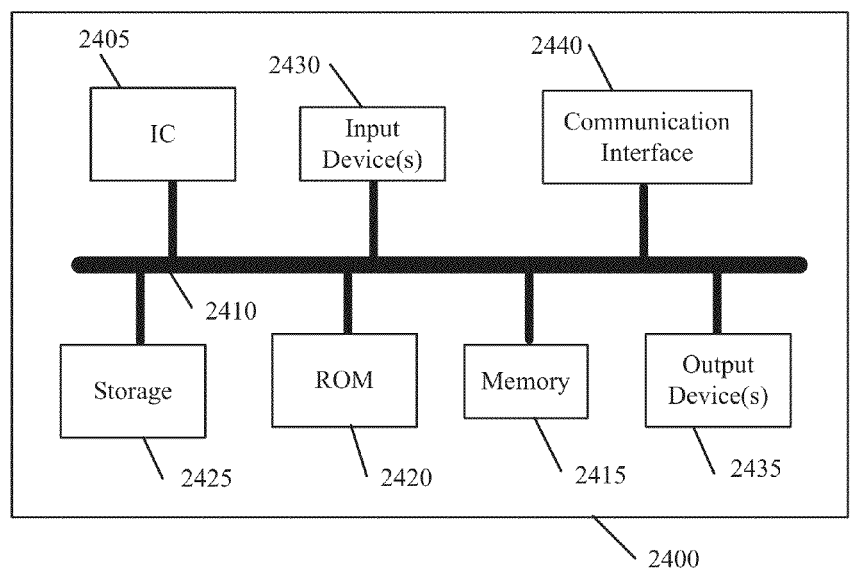
FIG. 24 conceptually illustrates a computing system that has an IC that includes a configurable circuit arrangement with configurable circuits, storage elements, and routing fabric.

FIG. 24 conceptually illustrates a more detailed example of a computing system 2400 that has an IC 2405, which includes a configurable circuit arrangement with configurable circuits, storage elements, and routing fabric of some embodiments of the invention that are described above. The system 2400 can be a stand-alone computing or communication device, or it can be part of another electronic device. As shown in FIG. 24, in addition to the IC 2405, the system 2400 also includes a bus 2410, a system memory 2415, a read-only memory 2420, a storage device 2425, input device(s) 2430, output device(s) 2435, and a communication interface 2440.

The bus 2410 collectively represents all system, peripheral, and chipset interconnects (including bus and non-bus interconnect structures) that communicatively connect the numerous internal devices of the system 2400. For instance, the bus 2410 communicatively connects the IC 2405 with the read-only memory 2420, the system memory 2415, and the permanent storage device 2425. The bus 2410 may be any of several types of bus structures including a memory bus or memory controller, a peripheral bus, and a local bus using any of a variety of conventional bus architectures. For instance, the bus 2410 architecture may include any of the following standard architectures: PCI, PCI-Express, VESA, AGP, Microchannel, ISA and EISA, to name a few.

From these various memory units, the IC 2405 receives data for processing and configuration data for configuring the configurable logic and/or interconnect circuits of the IC. When the IC 2405 has a processor, the IC also retrieves, from the various memory units, instructions to execute. The read-only-memory (ROM) 2420 stores static data and instructions that are needed by the IC 2405 and other modules of the system 2400.

Some embodiments of the invention use a mass-storage device (such as a magnetic disk to read from or write to a removable disk, or an optical disk for reading a CD-ROM disk or to read from or write to other optical media) as the permanent storage device 2425. Other embodiments use a removable storage device (such as a flash memory card or memory stick) as the permanent storage device 2425. The drives and their associated computer-readable media provide non-volatile storage of data, data structures, computer-executable instructions, etc. for the system 2400. Although the description of computer-readable media above refers to a hard disk, a removable magnetic disk, and a CD, it should be appreciated by those skilled in the art that other types of media which are readable by a computer, such as magnetic cassettes, digital video disks, and the like, may also be used in the exemplary operating environment.

Like the storage device 2425, the system memory 2415 is a read-and-write memory device. However, unlike storage device 2425, the system memory is a volatile read-and-write memory, such as a random access memory. Typically, system memory 2415 may be found in the form of random access memory (RAM) modules such as SDRAM, DDR, RDRAM, and DDR-2. The system memory stores some of the sets of instructions and data that the processor needs at runtime.

The bus 2410 also connects to the input and output devices 2430 and 2435. The input devices 2430 enable the user to enter information into the system 2400. The input devices 2430 can include touch-sensitive screens, keys, buttons, keyboards, cursor-controllers, touch screen, joystick, scanner, microphone, etc. The output devices 2435 display the output of the system 2400. The output devices 2435 include printers and display devices, such as cathode ray tubes (CRT), liquid crystal displays (LCD), organic light emitting diodes (OLED), plasma, projection, etc.

Finally, as shown in FIG. 24, bus 2410 also couples system 2400 to other devices through a communication interface 2440. Examples of the communication interface 2440 include network adapters that connect to a network of computers, or wired or wireless transceivers for communicating with other devices. Through the communication interface 2440, the system 2400 can be a part of a network of computers (such as a local area network ("LAN"), a wide area network ("WAN"), or an Intranet) or a network of networks (such as the Internet). The communication interface 2440 may provide such connection using wireless techniques, including digital cellular telephone connection, Cellular Digital Packet Data (CDPD) connection, digital satellite data connection, or the like.

While the invention has been described with reference to numerous specific details, one of ordinary skill in the art will recognize that the invention can be embodied in other specific forms without departing from the spirit of the invention. For example, many of the storage circuits can be used in ICs other than the ones described above, including ICs that do not include configurable circuits (e.g., pure ASICs, processors, etc.). Thus, one of ordinary skill in the art would understand that the invention is not to be limited by the foregoing illustrative details, but rather is to be defined by the appended claims.

What is claimed is:

1. An integrated circuit (IC) comprising:
a plurality of configurable circuits for performing a plurality of operations, each operation defined by one of a plurality of different sets of configuration data; and
a reconfiguration counter for providing a reconfiguration state to the configurable circuits, the reconfiguration state for selecting a set of the configuration data from the plurality of sets of configuration data, wherein the reconfiguration counter advances count to a next reconfiguration state when it receives a count enable signal, wherein the count enable signal is modulated so the configurable circuits perform the plurality of operations at a user specified data rate.

2. The IC of claim 1, wherein the user specified data rate correspond to a user defined clock.

3. The IC of claim 2, wherein the plurality of operations is performed as part of a user design, where the user design is specified by using the user defined clock.

4. The IC of claim 2, wherein the plurality of operations is for performing user defined operations that are defined by referencing the user defined clock.

5. The IC of claim 2, wherein the reconfiguration counter operates on a base clock that is faster than the user defined clock.

6. The IC of claim 1, wherein the count of the reconfiguration counter returns to an initial count when the reconfiguration state reaches a final reconfiguration state.

7. The IC of claim 1, wherein the reconfiguration state loopers to an initial reconfiguration state after reaching a terminal count.

8. An integrated circuit (IC) comprising:
a first set of reconfigurable circuits for implementing a first clock domain of a user design, wherein the first set of reconfigurable circuits has a first reconfiguration state that loopers at a first rate; and
a second set of reconfigurable circuits for implementing a second clock domain of the user design, wherein the second set of reconfigurable circuits has a second reconfiguration state that loopers at a second rate that is different from the first rate, wherein a particular reconfigurable circuit in the second set of reconfigurable circuits synchronously receives a signal from the first set of reconfigurable circuit.

9. The IC of claim 8, wherein the loopering of the first reconfiguration state is controlled by a first modulated count enable signal to a first reconfiguration counter that provides the first reconfiguration state.

10. The IC of claim 9, wherein the loopering of the second reconfiguration state is controlled by a second modulated count enable signal that is modulated differently from the first modulated count enable signal.

11. The IC of claim 8, wherein the loopering of the first reconfiguration state comprises a first number of reconfiguration states and the loopering of the second reconfiguration state comprises a second number of reconfiguration states, wherein the first number of reconfiguration states is different from the second number of reconfiguration states.

12. The IC of claim 8, wherein the loopering of the first reconfiguration state comprises a first number of reconfiguration states and the loopering of the second reconfiguration state comprises a second number of reconfiguration states, wherein the first number of reconfiguration states is the same as the second number of reconfiguration states.

13. The IC of claim 8, wherein the first reconfiguration state advances K states in L clock cycles, wherein the second reconfiguration state advances M states in N clock cycles, wherein K, L, M, and N are integers.

14. The IC of claim 13, wherein N is different than L.

15. The IC of claim 13, wherein M is different than K.

16. The IC of claim 8, wherein the synchronously received signal is statically scheduled in the user design.

17. An integrated circuit (IC) for implementing a user design, the user design comprising:
a first clock domain operating at a first user clock;
a second clock domain operating at a second user clock that is different from the first user clock; and
a signal that travels from the first clock domain to a second clock domain at a time slot that is statically scheduled.

18. The IC of claim 17, wherein the IC comprises a first set of reconfigurable circuits for implementing the first clock domain and a second set of reconfigurable circuits for implementing the second clock domain.

19. The IC of claim 18, wherein the first set of reconfigurable circuits is controlled by a first reconfiguration signal and the second set of reconfigurable circuits is controlled by a second reconfiguration signal.

20. The IC of claim 19, wherein the first reconfiguration signal completes one looper in one cycle of the first user clock and the second reconfiguration signal completes one looper in one cycle of the second user clock.

21. The IC of claim 19, wherein the statically scheduled time slot occurs when the first reconfiguration signal is at a first reconfiguration state and the second reconfiguration is at a second reconfigurable state.

\* \* \* \* \*